(12) United States Patent
Ho et al.

(10) Patent No.: US 11,855,221 B2
(45) Date of Patent: Dec. 26, 2023

(54) FERROELECTRIC SEMICONDUCTOR DEVICE AND METHOD

(71) Applicant: Taiwan Semiconductor Manufacturing Co., Ltd., Hsinchu (TW)

(72) Inventors: Chia-Cheng Ho, Hsinchu (TW); Ming-Shiang Lin, Hsinchu (TW); Jin Cai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/874,466

(22) Filed: Jul. 27, 2022

(65) Prior Publication Data

US 2022/0367718 A1    Nov. 17, 2022

Related U.S. Application Data

(62) Division of application No. 16/657,315, filed on Oct. 18, 2019, now Pat. No. 11,522,085.

(51) Int. Cl.
| | |
|---|---|
| *H01L 29/78* | (2006.01) |
| *H01L 29/51* | (2006.01) |
| *H01L 21/02* | (2006.01) |
| *H01L 29/66* | (2006.01) |

(52) U.S. Cl.
CPC .... *H01L 29/7851* (2013.01); *H01L 21/02181* (2013.01); *H01L 21/02321* (2013.01); *H01L 29/517* (2013.01); *H01L 29/66795* (2013.01)

(58) Field of Classification Search
CPC ........................ H01L 29/517; H01L 29/66795
See application file for complete search history.

(56) References Cited

U.S. PATENT DOCUMENTS

| | | | |
|---|---|---|---|
| 8,962,400 B2 | 2/2015 | Tsai et al. | |
| 9,093,514 B2 | 7/2015 | Tsai et al. | |
| 9,178,036 B1 | 11/2015 | Xie et al. | |
| 9,236,267 B2 | 1/2016 | De et al. | |

(Continued)

OTHER PUBLICATIONS

Jerry, M., et al., "Ferroelectric FET Analog Synapse for Acceleration of Deep Neural Network Training," 2017 IEEE International Electron Devices Meeting (IEDM), Dec. 2-6, 2017, 4 pages.

(Continued)

*Primary Examiner* — Trang Q Tran
(74) *Attorney, Agent, or Firm* — Slater Matsil, LLP

(57) ABSTRACT

A ferroelectric semiconductor device and method are described herein. The method includes performing a diffusion anneal process to drive elements of a dopant film through an amorphous silicon layer and into a gate dielectric layer over a fin to form a doped gate dielectric layer with a gradient depth profile of dopant concentrations. The doped gate dielectric layer is crystallized during a post-cap anneal process to form a gradient depth profile of ferroelectric properties within the crystallized gate dielectric layer. A metal gate electrode is formed over the crystallized gate dielectric layer to obtain a ferroelectric transistor with multi-ferroelectric properties between the gate electrode and the channel. The ferroelectric transistor may be used in deep neural network (DNN) applications.

20 Claims, 29 Drawing Sheets

(56) References Cited

U.S. PATENT DOCUMENTS

| | | | |
|---|---|---|---|
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,812,363 B1 | 11/2017 | Liao et al. | |
| 9,859,380 B2 | 1/2018 | Lee et al. | |
| 2018/0076334 A1* | 3/2018 | Ando | H01L 29/1083 |
| 2018/0240803 A1* | 8/2018 | Yoo | H01L 29/6684 |
| 2019/0304846 A1 | 10/2019 | Lee et al. | |
| 2020/0273700 A1 | 8/2020 | Cheng et al. | |

OTHER PUBLICATIONS

Ni, K., et al., "SoC Logic Compatible Multi-Bit FeMFET Weight Cell for Neuromorphic Applications," 2018 IEEE International Electron Devices Meeting (IEDM), Dec. 1-5, 2018, 4 pages.

\* cited by examiner

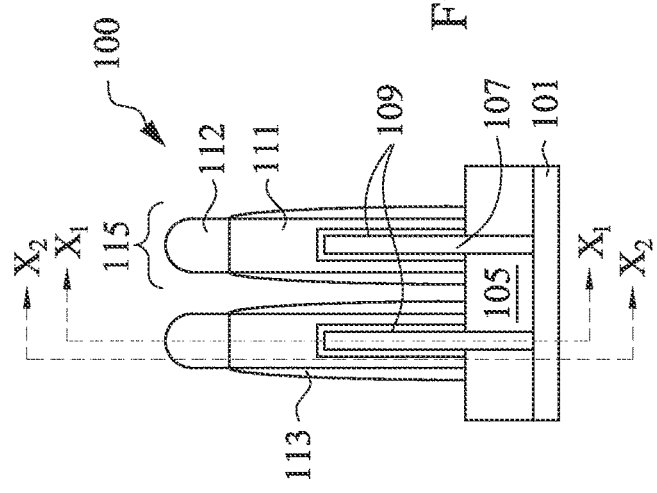
Figure 4B
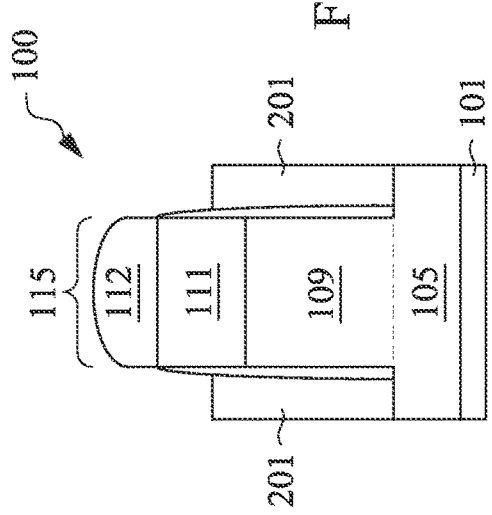
Figure 4D
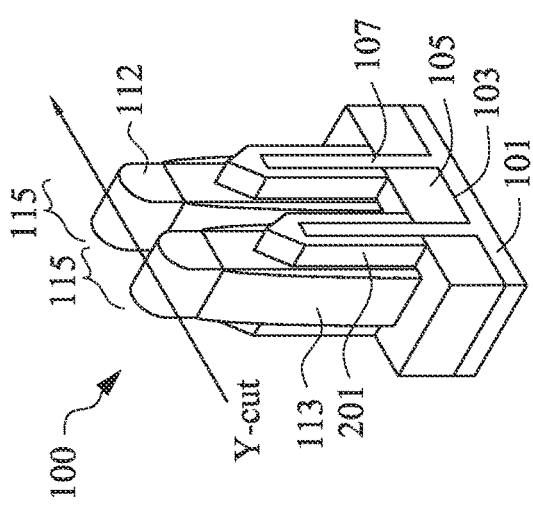
Figure 4A
Figure 4C

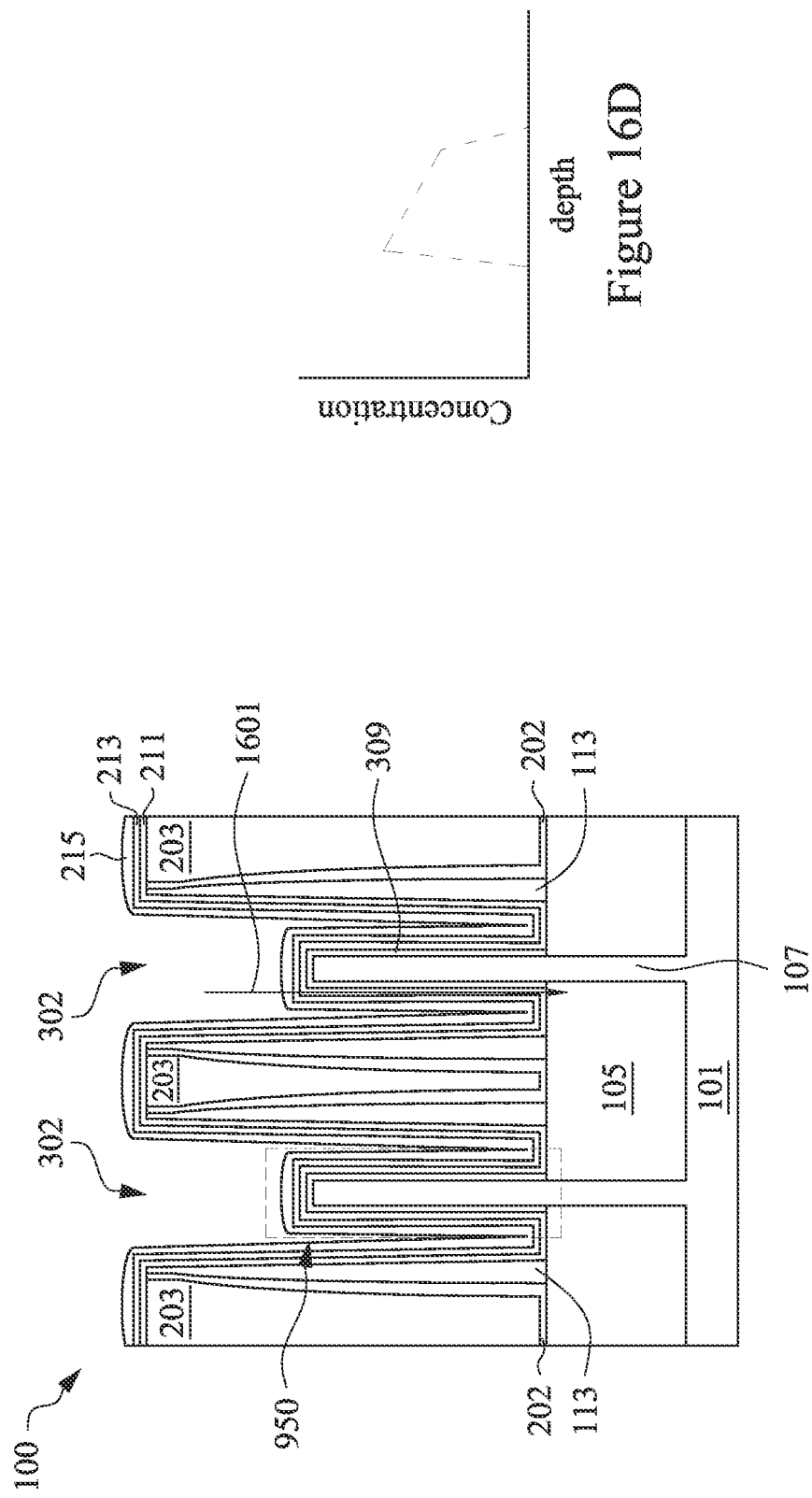

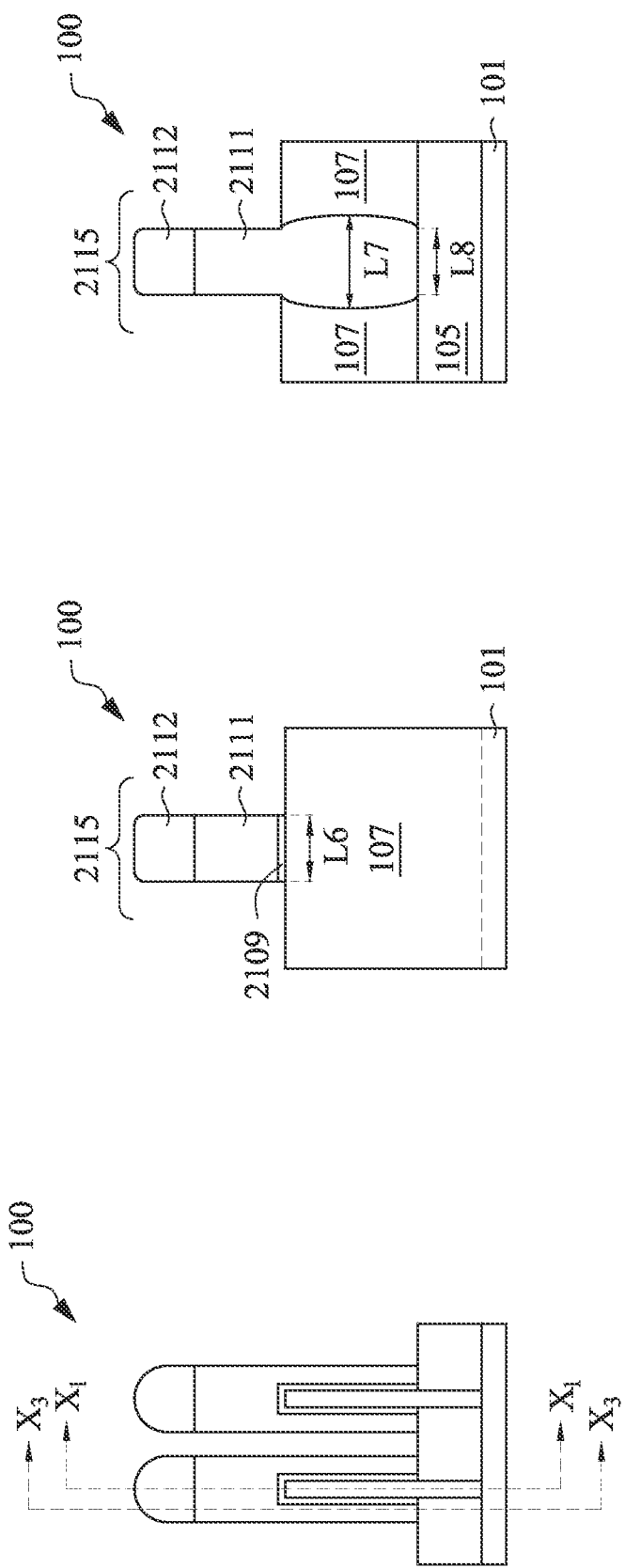

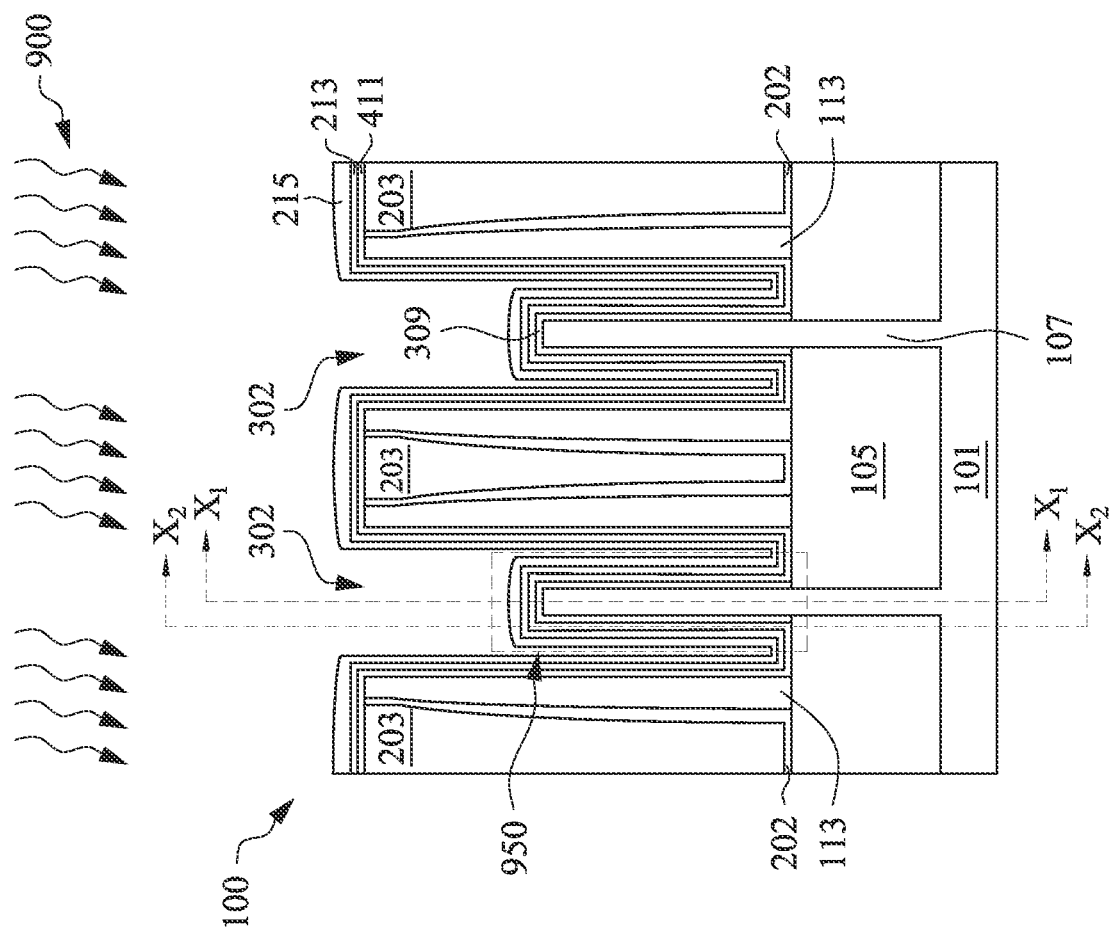

FERROELECTRIC SEMICONDUCTOR DEVICE AND METHOD

PRIORITY CLAIM AND CROSS-REFERENCE

This application is a divisional of U.S. patent application Ser. No. 16/657,315, filed Oct. 18, 2019, entitled "Ferroelectric Semiconductor Device and Method," which is hereby incorporated by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1B, 2A-2B, 3A-3D, 4A-4D, 5A-5D, 6A-6D, 7A-7D, 8A-8B, 9A-9B, 10-13 and 14A-14E illustrate intermediate steps in forming of gate stacks of a semiconductor device comprising a ferroelectric gate dielectric layer, according to an embodiment.

FIGS. 15A-15C, 16A-16D and 17A-17B illustrate intermediate steps in forming tapered gate stacks of a semiconductor device comprising a ferroelectric gate dielectric layer, according to another embodiment.

FIGS. 21A-21C, 22A-22C, and 23A-23C illustrate intermediate steps in forming bamboo-shaped gate stacks of a semiconductor device comprising a ferroelectric gate dielectric layer, according to another embodiment.

DETAILED DESCRIPTION

Figure 1B:
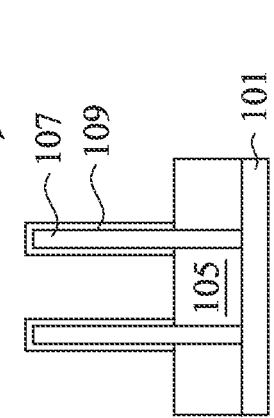

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described below with respect to specific embodiments, including protective thin films and methods for preventing surface damage of a 3D structure during formation of FinFET devices. Embodiments, however, are not intended to be limited, and may be utilized in a wide variety of embodiments beyond the formation of FinFET devices.

Figure 1A:
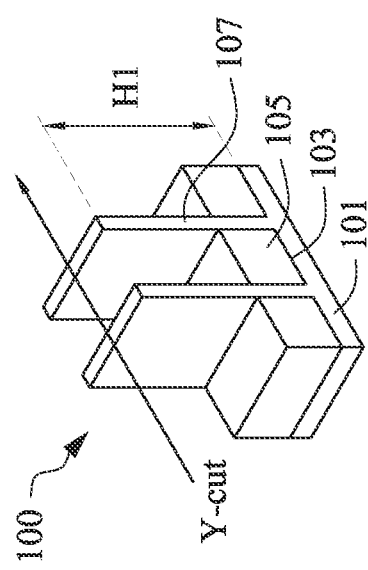

With reference now to FIGS. 1A-1B, in FIG. 1A there is illustrated a perspective view (3D view) of a semiconductor device 100 (e.g., finFET device) and in FIG. 1B there is illustrated a cross-sectional view (Y-cut) of the semiconductor device 100 as taken through the cut-line (Y-cut) in FIG. 1A. In an embodiment the semiconductor device 100 comprises a substrate 101 and first trenches 103. The substrate 101 may be a silicon substrate, although other substrates, such as semiconductor-on-insulator (SOI), strained SOI, and silicon germanium on insulator, could be used. Suitable structures for the substrate include, but are not limited to: a single layer structure with a height of between about 30 nm and about 100 nm, SRB, or multi-layered structures with any suitable number of layers with each layer having a thickness of between about 3 nm and about 10 nm. Materials suitable for use in the substrate 101 include, but are not limited to: Si, SiGe, Ge, GeSn, SiGen, III-Vs, and the like. However, any suitable structures and any suitable materials may be utilized for the substrate. In some embodiments, the substrate 101 may be a p-type semiconductor, although in other embodiments, it could be an n-type semiconductor and/or combinations thereof.

The first trenches 103 may be formed as an initial step in the eventual formation of first isolation regions 105. The first trenches 103 may be formed using a masking layer (not separately illustrated in FIGS. 1A-1B) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally form fins 107 from those portions of the substrate 101 that remain unremoved. For convenience the fins 107 have been illustrated in the figures as being integrated with the substrate 101, although a physical separation may or may not be present. These fins 107 may be used, as discussed below, to form the channel region of multiple-gate FinFET transistors. While FIGS. 1A and 1B only illustrate two of the fins 107 formed from the substrate 101, any number of fins 107 may be utilized.

The fins 107 may be formed such that they have a width at the surface of the substrate 101 of between about 4 nm and about 8 nm. Additionally, the fins 107 may be spaced apart from each other by a fin pitch of between about 12 nm and about 50 nm. By spacing the fins 107 in such a fashion, the fins 107 may each form a separate channel region while still being close enough to share a common gate (discussed further below).

However, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing. As such, the fins 107 may be formed to a first height H1 of between about 30 nm and about 100 nm. However, any suitable height may be used.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

Figure 2B:
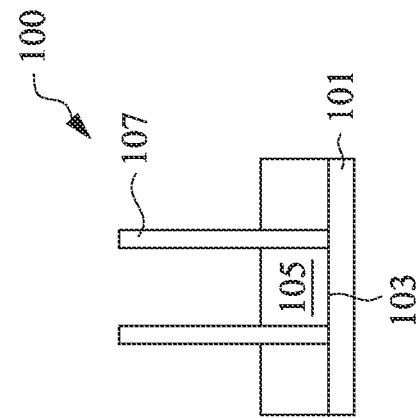
Figure 2A:
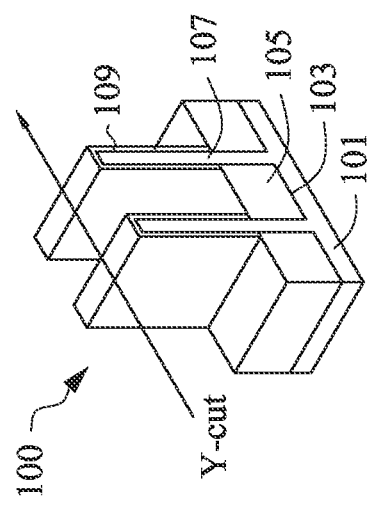

With reference now to FIGS. 2A-2B, these figures illustrate the formation of a dummy gate dielectric 109 over the structure of FIGS. 1A and 1B, respectively. After the first isolation regions 105 have been formed, a dummy gate dielectric 109 is formed over each of the fins 107. In an embodiment the dummy gate dielectric 109 may be formed by plasma-enhanced atomic layer deposition (PEALD), plasma enhanced chemical vapor deposition (PECVD), thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 1 nm to about 3 nm. However, any suitable thickness may be used. The dummy gate dielectric 109 may also be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials and any suitable thicknesses of these materials may also be used for the dummy gate dielectric 109.

Figure 3B:
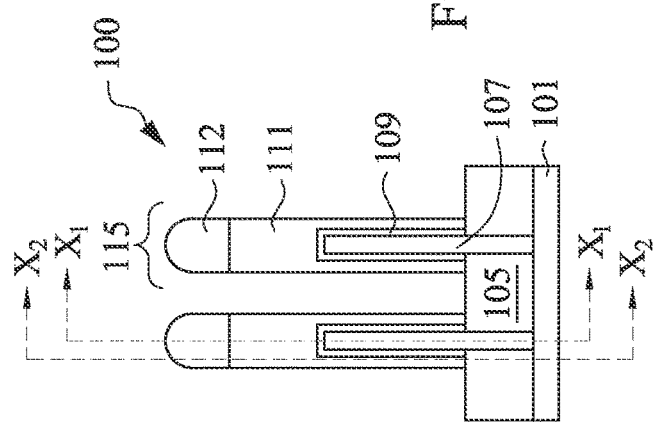
Figure 3D:
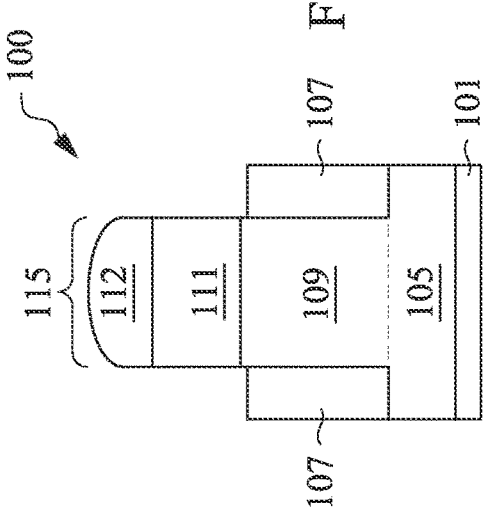
Figure 3A:
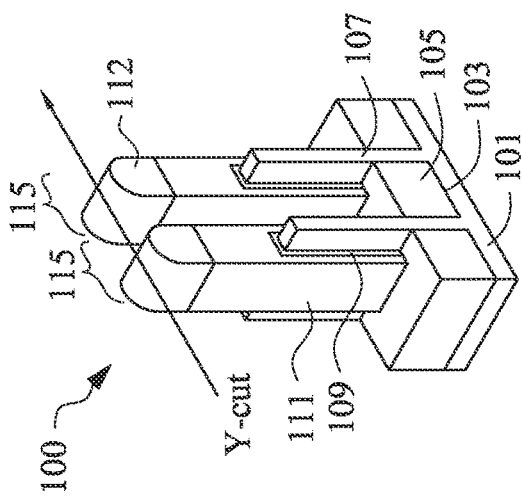
Figure 3C:
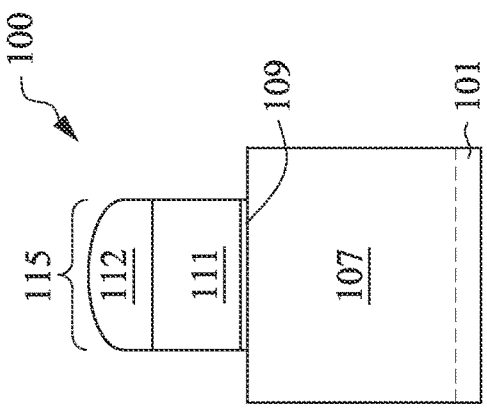

With reference now to FIGS. 3A-3D, these figures illustrate the formation of a dummy gate electrode 111 and a gate mask 112 over the dummy gate dielectric 109 of the structure illustrated in FIGS. 2A and 2B, respectively. FIG. 3A is a perspective view (3D view), FIG. 3B is the cross-sectional (Y-cut) view through the cut-line Y in FIG. 3A, and FIGS. 3C and 3D are the cross-sectional (X1-cut) and (X2-cut) views through the cut-lines X1 and X2 of FIG. 3B, respectively. The dummy gate electrode 111 may comprise a conductive material and may be selected from a group comprising polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 8 nm to about 20 nm. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of dummy gate stacks 115 over the fins 107. The dummy gate stacks 115 define multiple channel regions located on each side of the fins 107 beneath the dummy gate dielectric 109. The dummy gate stacks 115 may be formed by depositing and patterning a gate mask 112 on the dummy gate electrode 111 using, for example, deposition and photolithography techniques known in the art. The gate mask 112 may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The gate mask 112, the dummy gate electrode 111, and the dummy gate dielectric 109 may be etched using a photolithographic masking and dry etching process to form the dummy gate stacks 115.

With reference now to FIGS. 4A-4D, these figures illustrate the formation of spacers 113 over sidewalls of the dummy gate stacks 115 and the formation of the dual epitaxial growth of the S/D regions of the fins 107 illustrated in FIGS. 3A-3D. FIG. 4A is a perspective view (3D view), FIG. 4B is the cross-sectional (Y-cut) view through the cut-line Y in FIG. 4A, and FIGS. 4C and 4D are the cross-sectional (X1-cut) and (X2-cut) views through the cut-lines X1 and X2 of FIG. 4B, respectively. Once the dummy gate stacks 115 have been patterned, the spacers 113 may be formed. The spacers 113 may be formed on opposing sides of the dummy gate stacks 115. The spacers 113 may be formed, for example, by blanket depositing a spacer layer (not separately illustrated in FIGS. 4A-4D) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The spacers 113 may then be patterned, such as by one or more etches to remove the spacer layer from the horizontal surfaces of the structure, to form the spacers 113. In an embodiment the spacers 113 may be formed to have a thickness of between about 5 Å and about 500 Å.

Once the spacers 113 have been patterned, the source/drain regions 201 may be grown in contact with each of the fins 107. In an embodiment the source/drain regions 201 may be grown and, in some embodiments the source/drain regions 201 may be grown to form a stressor that will impart a stress to the channel regions of the fins 107 located underneath the dummy gate stacks 115. In an embodiment wherein the fins 107 comprise silicon and the FinFET is a p-type device, the source/drain regions 201 may be grown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes. As such, the source/drain regions 201 may be formed to a thickness of between about 3 nm and about 8 nm.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. Examples of suitable p-type dopants include, but are not limited to: SiB, SiGa, SiGeB, SiGeGa, GeB, GeGa or other SiGeSn III-Vs. In another embodiment, n-type dopants such as phosphorous, arsenic, antimony, or the like may be implanted to form an NMOS device. Examples of suitable n-type dopants include, but are not limited to: SiP, SiAs, SiGeP, SiGeAs, GeP, GeAs or other SiGeSn III-Vs. These dopants may be implanted using the dummy gate stacks 115 and the spacers 113 as masks and may be implanted within the source/drain regions 201 with a dopant concentration of between about $5 \text{ E}^{20}\text{cm}^{-3}$ and about $6 \text{ E}^{21}\text{cm}^{-3}$. The dopants may be implanted using any suitable dopant implantation techniques. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Figure 5B:
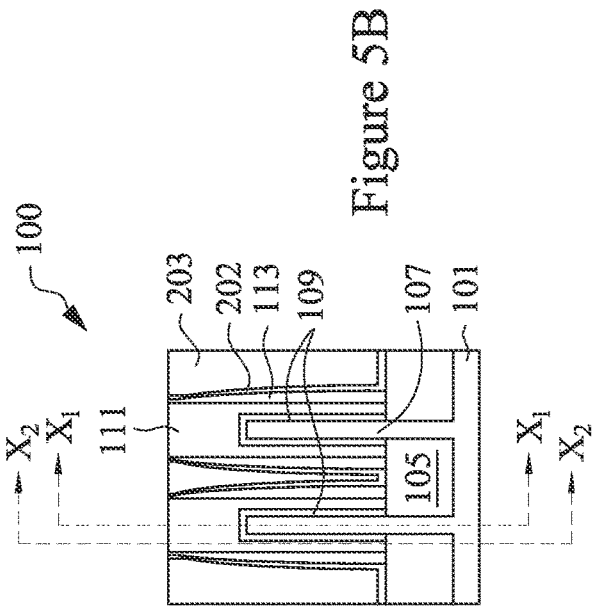
Figure 5D:
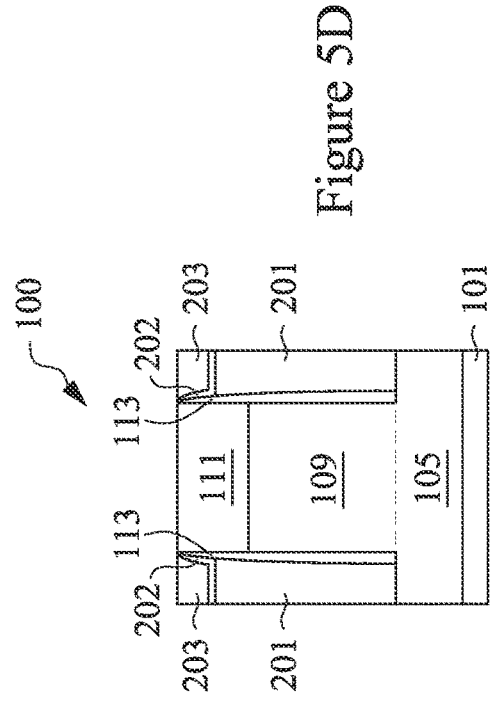
Figure 5A:
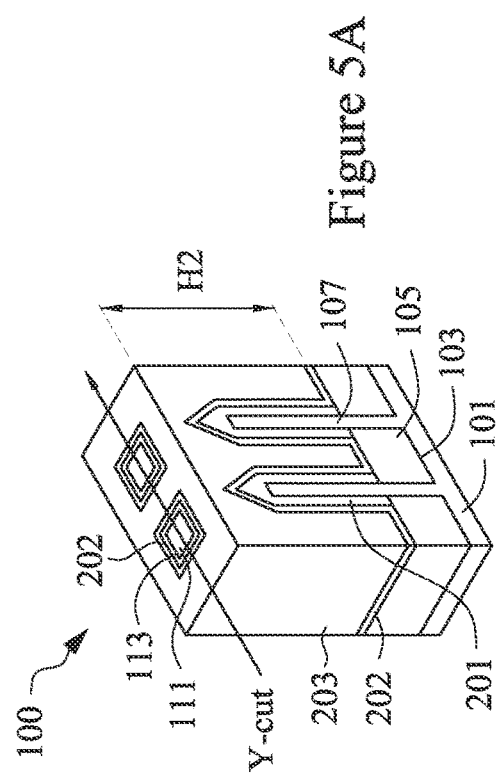
Figure 5C:
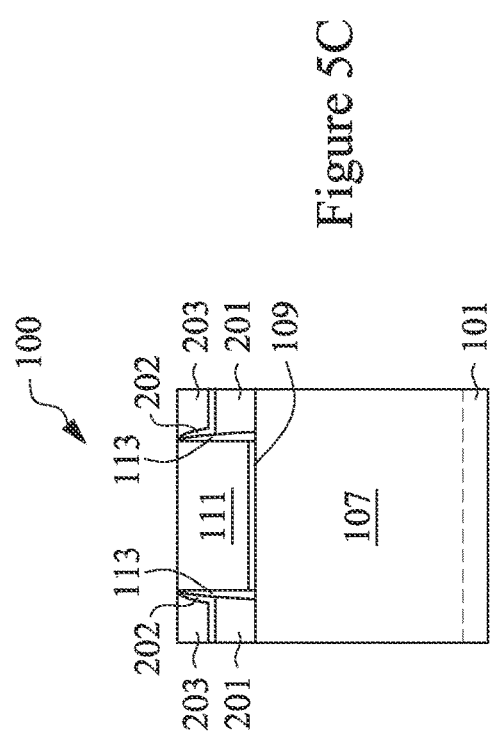

With reference now to FIGS. 5A-5D, these figures illustrate the formation of a contact etch stop layer (e.g., CESL 202) and an inter-layer dielectric layer (e.g., ILD layer 203) over the spacers 113 and source/drain regions 201 illustrated in FIGS. 4A-4D. FIGS. 5A-5D further illustrate the annealing of the ILD layer 203 and chemical mechanical planarization (CMP) to remove the gate mask 112 and expose the dummy gate electrode 111 of the remaining structures. FIG. 5A is a perspective view (3D view), FIG. 5B is the cross-sectional (Y-cut) view through the cut-line Y in FIG. 5A, and FIGS. 5C and 5D are the cross-sectional (X1-cut) and (X2-cut) views through the cut-lines X1 and X2 of FIG. 5B, respectively.

Once the source/drain regions 201 have been formed and the dopants have been implanted, the CESL 202 is formed over the dummy gate stacks 115 and the source/drain regions 201. Generally, the CESL 202 provides a mechanism to stop an etch process when forming, e.g., contacts or vias and may be formed of a dielectric material having a different etch selectivity from adjacent layers or components. The CESL 202 is conformally deposited on surfaces of the source/drain regions 201, sidewalls and top surfaces of the spacers 113, top surfaces of the gate mask 112, and top surfaces of the first isolation regions 105 using any suitable deposition techniques (e.g., ALD, CVD, MBD, or the like). According to some embodiments, the CESL 202 comprises a low-k dielectric material (e.g., silicon oxycarbide, silicon oxycarbonitride, the like, or a combination thereof). In other embodiments, the CESL 202 may comprise a non-low-k dielectric material instead of or in addition to the low-k dielectric material. Suitable non-low-k dielectric materials include, but are not limited to: silicon nitride, silicon carbon nitride, the like, or a combination thereof.

Next, the ILD layer 203 is deposited over the CESL 202. In some embodiments, the ILD layer 203 may comprise or be silicon dioxide, a low-k dielectric material, such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The ILD layer 203 may be deposited by spin-on, CVD, FCVD, LPCVD, PVD, PECVD, although other suitable deposition techniques may also be used. In some embodiments, a first ILD annealing process may be performed prior to planarizing the ILD layer 203.

Once the ILD layer 203 has been deposited and/or annealed, the ILD layer 203 is planarized with the spacers 113 to remove the gate mask 112 and expose the dummy gate electrode 111 of the remaining structures. The ILD layer 203 may be planarized using, for example, chemical mechanical planarization (CMP), although any suitable process may be utilized. Once planarized, the ILD layer 203 may be subjected to a post-CMP ILD annealing process. As such, the ILD layer 203 may be formed to a second height H2 of between about 100 Å and about 3,000 Å. However, any suitable height may be used.

Figure 6A:
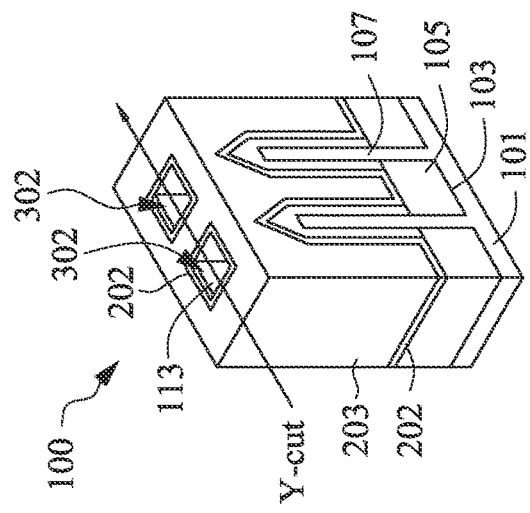
Figure 6B:
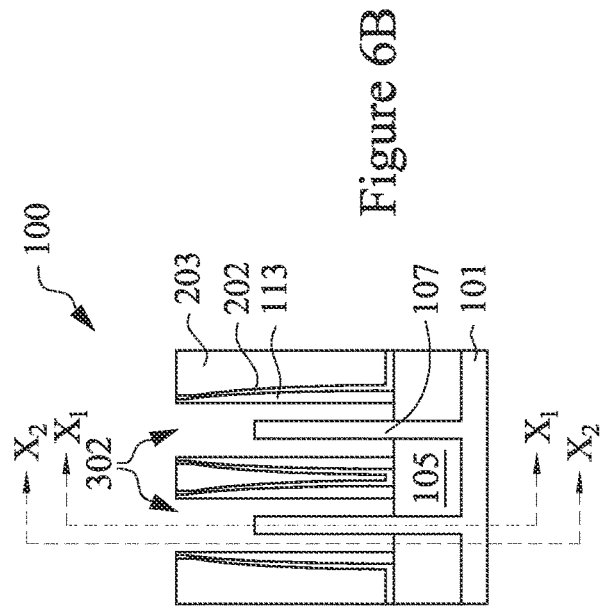
Figure 6C:
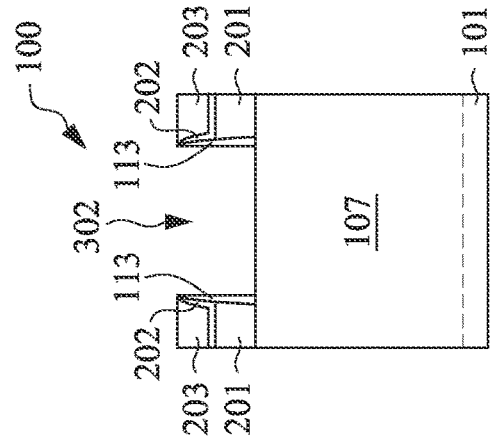
Figure 6D:
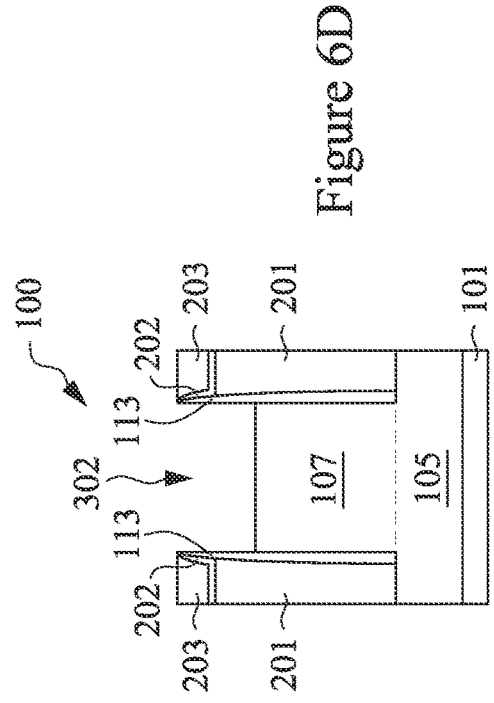

With reference now to FIGS. 6A-6D, these figures illustrate the removal of dummy gate electrode 111 and the dummy gate dielectric 109 over the fins 107 illustrated in FIGS. 5A-5D. FIG. 6A is a perspective view (3D view), FIG. 6B is the cross-sectional (Y-cut) view through the cut-line Y in FIG. 6A, and FIGS. 6C and 6D are the cross-sectional (X1-cut) and (X2-cut) views through the cut-lines X1 and X2 of FIG. 6B, respectively.

Once the gate mask 112 has been removed and the dummy gate electrode 111 has been exposed, the material of the dummy gate electrode 111 and the dummy gate dielectric 109 is removed such that openings 302 expose the channel regions of fins 107. In an embodiment the dummy gate electrode 111 and the dummy gate dielectric 109 may be removed using, e.g., wet or dry etching processes that utilizes etchants that are selective to the material of the dummy gate electrode 111 and the dummy gate dielectric 109. In one embodiment the dummy gate electrode 111 may be removed using a wet etchant such as dilute hydrofluoric acid and hydrogen peroxide. However, any suitable removal process may be utilized. FIG. 6D illustrates the exposed channel region of the fins 107 as patterned to illustrate that the exposed channel region is set back from the other surfaces illustrated in the cross-section view of X2-cut of the cut-line X2.

Figure 7B:
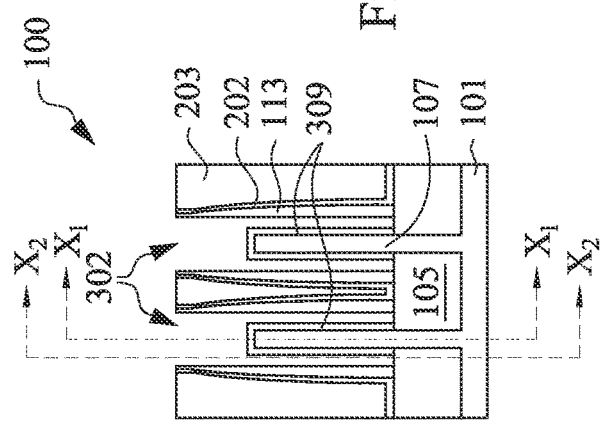
Figure 7D:
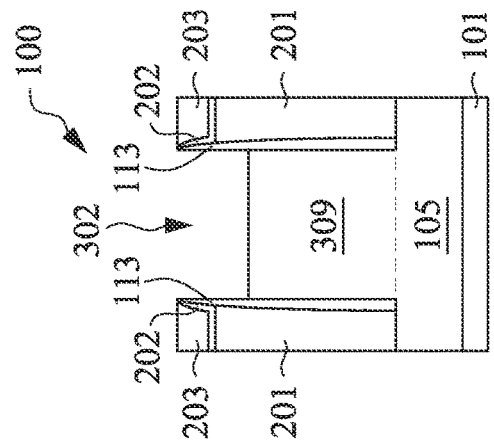
Figure 7A:
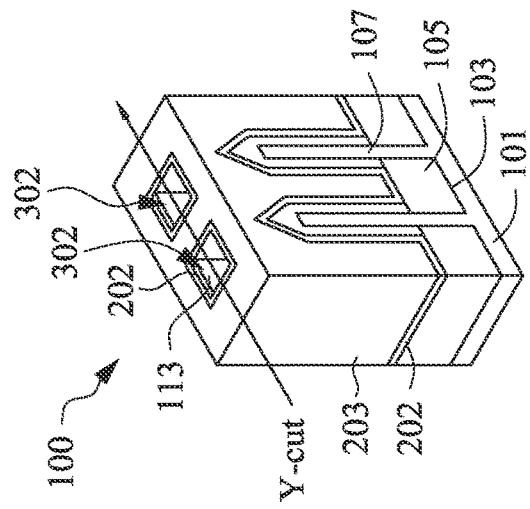
Figure 7C:
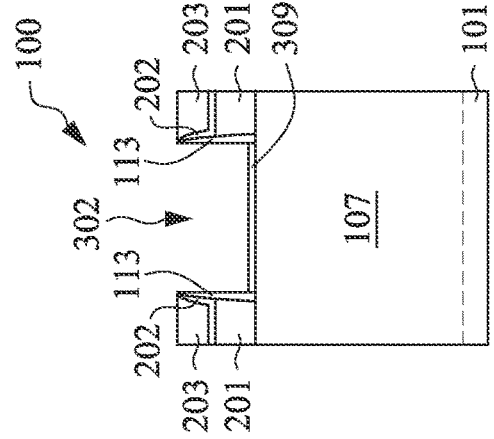

With reference now to FIGS. 7A-7D, these figures illustrate the deposition of an interfacial layer 309 over the exposed portions of the channel regions of the fins 107 illustrated in FIGS. 6A-6D. FIG. 7A is a perspective view (3D view), FIG. 7B is the cross-sectional (Y-cut) view through the cut-line Y in FIG. 7A, and FIGS. 7C and 7D are the cross-sectional (X1-cut) and (X2-cut) views through the cut-lines X1 and X2 of FIG. 7B, respectively. In an embodiment the interfacial layer 309 may be a material such as silicon dioxide formed through a process such as in situ steam generation (ISSG). However, any suitable material or process of formation may be utilized.

With reference now to FIGS. 8-13, these figures illustrate intermediate steps in a process of forming a metal gate electrode over the interfacial layer 309 and over the other exposed surfaces of the structure illustrated in the Y-cut of FIG. 7B, in accordance with embodiments of the present disclosure. FIGS. 8-13 are illustrated as magnified views with respect to FIG. 7B in order to show details of the intermediate steps of the process. The corresponding views (e.g., perspective view (3D view), cross-sectional view (X1-cut), and cross-sectional view (X2-cut)) through the cut-lines X1 and X2, respectively, of the structures illustrated in FIGS. 8-13 are not separately illustrated. However, as would be understood by one of ordinary skill in the art, the structures associated with these corresponding views would follow from the intermediate steps of the process as illustrated in FIGS. 8-13.

Figure 8B:
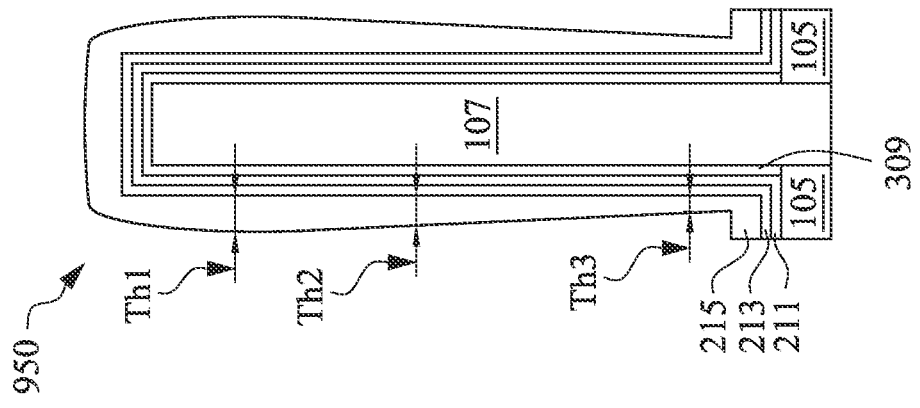
Figure 8A:
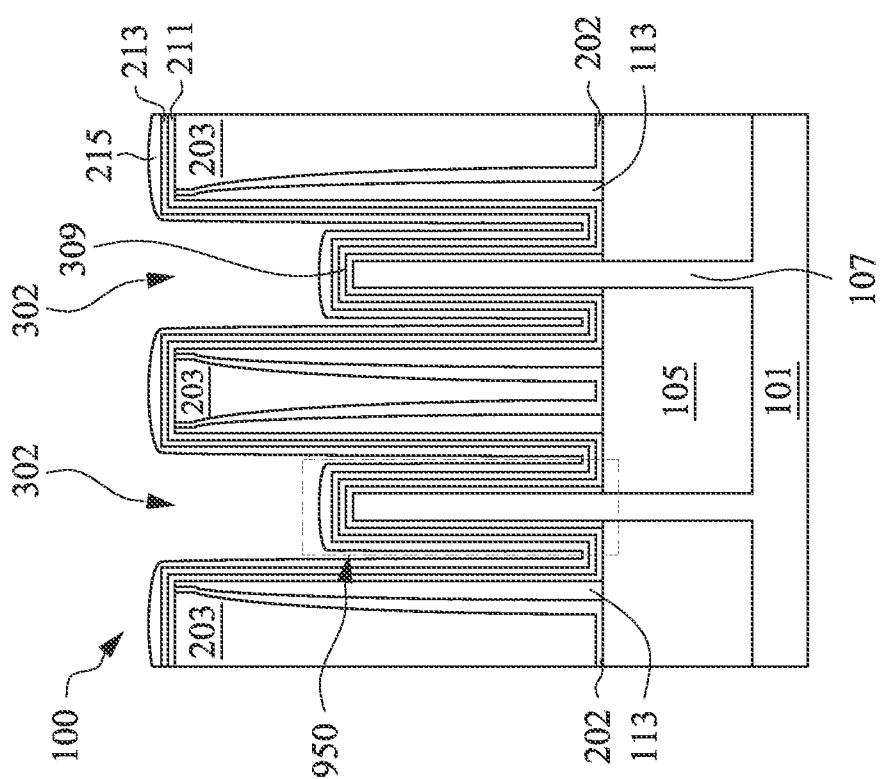

FIG. 8A illustrates, once the interfacial layer 309 has been formed over the fins 107, the blanket deposition of a gate dielectric layer 211 over the complex surfaces of the semiconductor device 100 within the openings 302, over the channel regions of the fins 107, and over the planar surfaces of the ILD layer 203 outside of the openings 302 in the semiconductor device 100. In some embodiments, the gate dielectric layer 211 is deposited as an amorphous matrix layer using a high-k material (e.g., with a relative permittivity greater than about 5) such as hafnium oxide ($HfO_2$), zirconium oxide ($ZrO_2$), HfSiO, HfSiON, HfTaO, HfTiO, HfZrO, LaO, ZrO, $Ta_2O_5$, combinations of these, or the like may be used. According to some embodiments, the gate dielectric layer 211 is deposited through a process such as atomic layer deposition (ALD) to a thickness of between about 10 Å and about 50 Å, such as about 20 Å. However, any suitable materials, any suitable deposition process, and any suitable thicknesses may be utilized for the gate dielectric layer 211.

In an embodiment in which an atomic layer deposition process is utilized, the atomic layer deposition process may be performed by utilizing a cyclic set of steps which may introduce a first precursor for use in a first self-limiting reaction, purge the first precursor, introduce a second precursor for use in a second self-limiting reaction, and purge the second precursor to complete a first cycle. Once the first cycle has been completed, the first cycle may be repeated for a second cycle, with each cycle depositing a monolayer of the desired material until a desired thickness is reached. For example, in an embodiment in which the gate dielectric layer 211 is hafnium oxide ($HfO_2$), a first precursor such as hafnium chloride ($HfCl_4$) may be introduced and then purged, and a second precursor comprising oxygen such as water ($H_2O$), de-ionized water (DI), ozone ($O_3$), or any other suitable oxygen containing molecule may be introduced as the second precursor to form a single monolayer of hafnium oxide ($HfO_2$). However, any suitable deposition process or precursors may be utilized.

FIG. 8A further illustrates a deposition process of buffer layer 213 over the gate dielectric layer 211. In an embodiment the buffer layer 213 may comprise a material such as amorphous silicon (a-Si) which is deposited as a single amorphous layer using a process such as atomic layer deposition (ALD), or the like. According to some embodiments, the buffer layer 213 is deposited to a thickness of between about 10 Å and about 30 Å, such as about 15 Å. However, any suitable material, any suitable deposition process, and any suitable thickness may be utilized for the buffer layer 213.

Once the buffer layer 213 has been formed, a dopant film 215 is deposited over the buffer layer 213. The dopant film 215 may be deposited as a single thin film layer using one or more materials including dopant metals such as Zr, Al, La, Y, Gd, Sr, or the like. For example, the dopant film 215 may be a material such as zirconium oxide ($ZrO_2$), aluminum oxide ($Al_2O_3$), combinations of these, or the like. However, any suitable material which can supply suitable dopants may be utilized.

In an embodiment the dopant film 215 may be deposited using a deposition process such as atomic layer deposition, chemical vapor deposition, physical vapor deposition, combinations, of these, or the like. In an embodiment in which the dopant film 215 is deposited using an atomic layer deposition process, the atomic layer deposition process may be performed by utilizing another cyclic set of steps in which a third precursor and a fourth precursor are used to deposit a monolayer of the desired material until a desired thickness of the dopant film 215 is reached. For example, in an embodiment in which the dopant film 215 is zirconium oxide ($ZrO_2$), a third precursor such as zirconium chloride ($ZrCl_4$) may be introduced and then purged, and a fourth precursor comprising oxygen such as water ($H_2O$), deionized water (DI), ozone ($O_3$), or any other suitable oxygen containing molecule may be introduced as the fourth precursor to form a single monolayer of zirconium oxide ($ZrO_2$). According to some embodiments, the cycle is repeated until the dopant film 215 is deposited to an average thickness of between about 1 Å and about 50 Å, such as about 20 Å. However, any suitable material, any suitable deposition process, and any suitable thickness may be utilized for the dopant film 215.

FIG. 8B illustrates, in a magnified view, a section 950 of the semiconductor device 100 that is indicated in FIG. 8A with a dashed outline. In some embodiments, because the deposition processes (including the ALD process) are not perfectly conformal, different thicknesses of the dopant film 215 are formed along sidewalls of the spacers 113 and sidewalls of the fins 107. In some embodiments, the dopant film 215 is formed within the openings 302 along vertical sidewalls of the fins 107 having a first thickness profile comprising, for example, a first thickness Th1 at a top of the fins 107, a second thickness Th2 in the middle of the fins 107, and a third thickness Th3 at the bottom of the fins 107. According to some embodiments, the first thickness profile of the first thickness Th1 may be between about 20 Å and about 50 Å, such as about 30 Å, the second thickness Th2 may be between about 10 Å and about 40 Å, such as about 20 Å, and the third thickness Th3 may be between about 1 Å and about 30 Å, such as about 10 Å. However, any suitable thicknesses may be utilized.

Figure 9B:
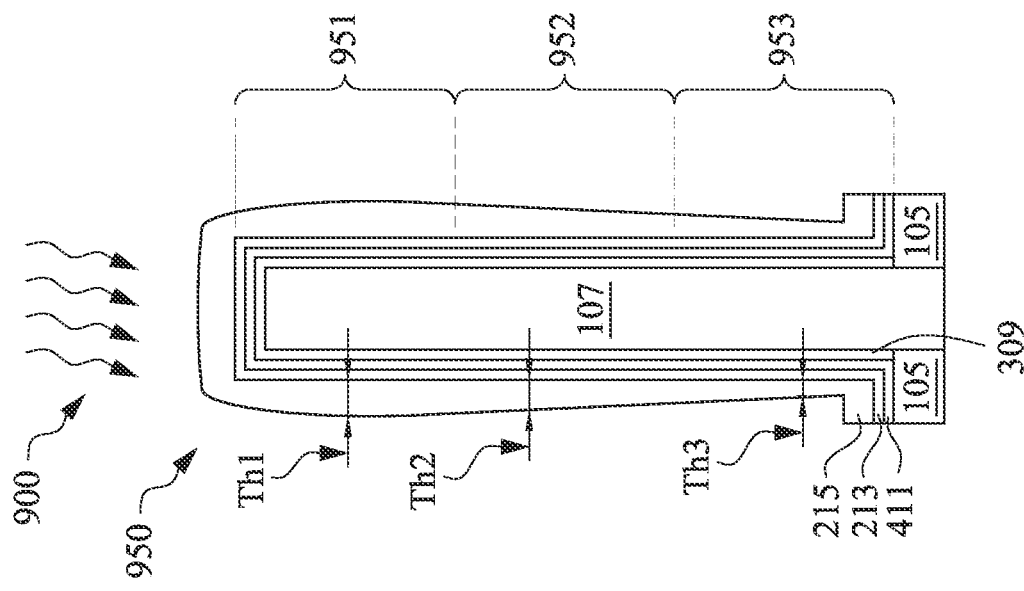
Figure 9A:
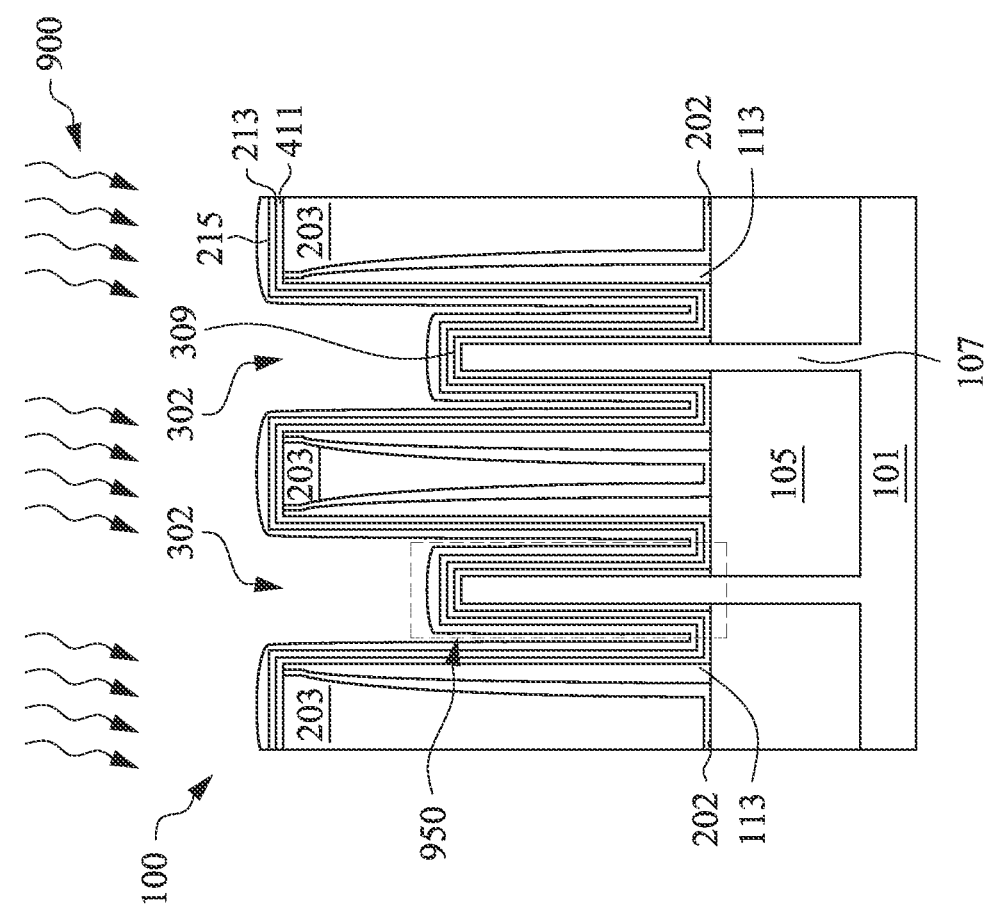

FIG. 9A illustrates a diffusion anneal process 900 (e.g., a drive-in thermal anneal) in accordance with some embodiments. Once the dopant film 215 has been deposited, the diffusion anneal process 900 may be performed to diffuse the dopant elements (e.g., Si, Zr, Al, La, Y, Gd, Sr, or the like) of the buffer layer 213 and the dopant film 215 into the gate dielectric layer 211 such that a gradient profile of the dopant elements is formed within the gate dielectric layer 211.

In some embodiments, the diffusion anneal process 900 may be performed as a low-temperature soak anneal process at a temperature below about 700° C., such as about 450° C. for a period of between about 5 sec and about 1800 sec, such as about 300 sec. However, any suitable temperatures and any suitable periods may be used to perform any of the diffusion anneal process 900.

In other embodiments, the diffusion anneal process 900, instead of being performed after the dopant film 215 has been fully deposited, may be performed during the deposition process of the dopant film 215. In such an embodiment the diffusion anneal process 900 is performed by performing the atomic layer deposition process at a temperature between about 450° C. and about 700° C.

By performing the diffusion anneal process 900, the dopants (e.g., Zr, Si, or the like) will diffuse from being within the dopant film 215, through or from (in embodiments in which silicon is desired to be one of the dopants) the buffer layer 213, and into the gate dielectric layer 211. Additionally, by controlling the diffusion anneal process 900 such that the temperature of the diffusion anneal process 900 remains below 700° C., the diffusion anneal process 900 does not, or only minimally, drive the dopant elements into the interfacial layer 309 and the fins 107, thereby diffusing the dopants into the gate dielectric layer 211 but no further. After the diffusion anneal process 900, the gate dielectric layer 211 and the dopant elements driven therein, may be referred to herein as a doped gate dielectric layer 411.

Additionally, during the diffusion anneal process 900, the buffer layer 213, in addition to supplying dopants such as silicon, also serves to buffer and separate the gate dielectric layer 211 from the dopant film 215. Over doping and/or agglomeration of dopants in the gate dielectric layer 211 can lead to device defects such as reduced ferroelectricity and high leakage current. Depending on the desired ferroelectric properties for the gate dielectric layer 211, some dopants (e.g., Al, Y, La, Ga) may be driven into the gate dielectric layer 211 with atomic percentages between about 5% and about 20% and other dopants (e.g., Zr) may be driven into the gate dielectric layer 211 with atomic percentages between about 30% and about 50%. By using the buffer layer 213, better control is achieved over the amount and the distribution of the dopants driven from the dopant film 215 into the gate dielectric layer 211. As such, fewer defects will occur in the gate dielectric layer 211.

FIG. 9B illustrates, in a magnified view, the section 950 of the semiconductor device 100 that is indicated in FIG. 9A with a dashed outline. According to some embodiments, during the diffusion anneal process 900, the dopants (e.g., Zr, Si, or the like) are driven into the gate dielectric layer 211 such that some regions of the doped gate dielectric layer 411 have higher dopant concentrations than other regions. In particular, because of the shape of the dopant film 215 and the different thicknesses of the dopant film 215 that are present along the sidewalls of the fins 107, there will not be an even diffusion of the dopants into the gate dielectric layer 211. Such an uneven diffusion will cause a dopant concentration of the doped gate dielectric layer 411 to be uneven as well, thereby causing the doped gate dielectric layer 411 to have the gradient profile of the dopant elements.

According to some embodiments, after the diffusion anneal process 900, the doped gate dielectric layer 411 comprise a first doped region 951 with a first average dopant concentration, a second doped region 952 with a second average dopant concentration, and a third doped region 953 with a third average dopant concentration. The first, second and third average dopant concentrations may each be uniform or gradient and may be within discrete ranges or contiguous ranges. In some embodiments, the first, second and third dopant concentrations may comprise contiguous ranges of concentrations such that the doped gate dielectric layer 411 is formed with a first dopant concentration depth profile with a continuous gradient from the top of the fins 107 to the bottom of the fins 107. According to some embodiments, the first doped region 951 comprises a first dopant concentration with an atomic percentage (at. %) of between about 10 at. % and about 20 at. %, such as about 15 at. %; the second doped region 952 has a second dopant concentration lower than the first concentration, with the second dopant concentration having an atomic percentage (at. %) of between about 5 at. % and about 10 at. %, such as about 7 at. %; and the third doped region 953 has a third dopant concentration with an atomic percentage (at. %) lower than the second concentration, such as being between about 1 at. % and about 5 at. %, such as about 3 at. %. However, any suitable dopant concentrations and any suitable ranges may be utilized.

Figure 10:
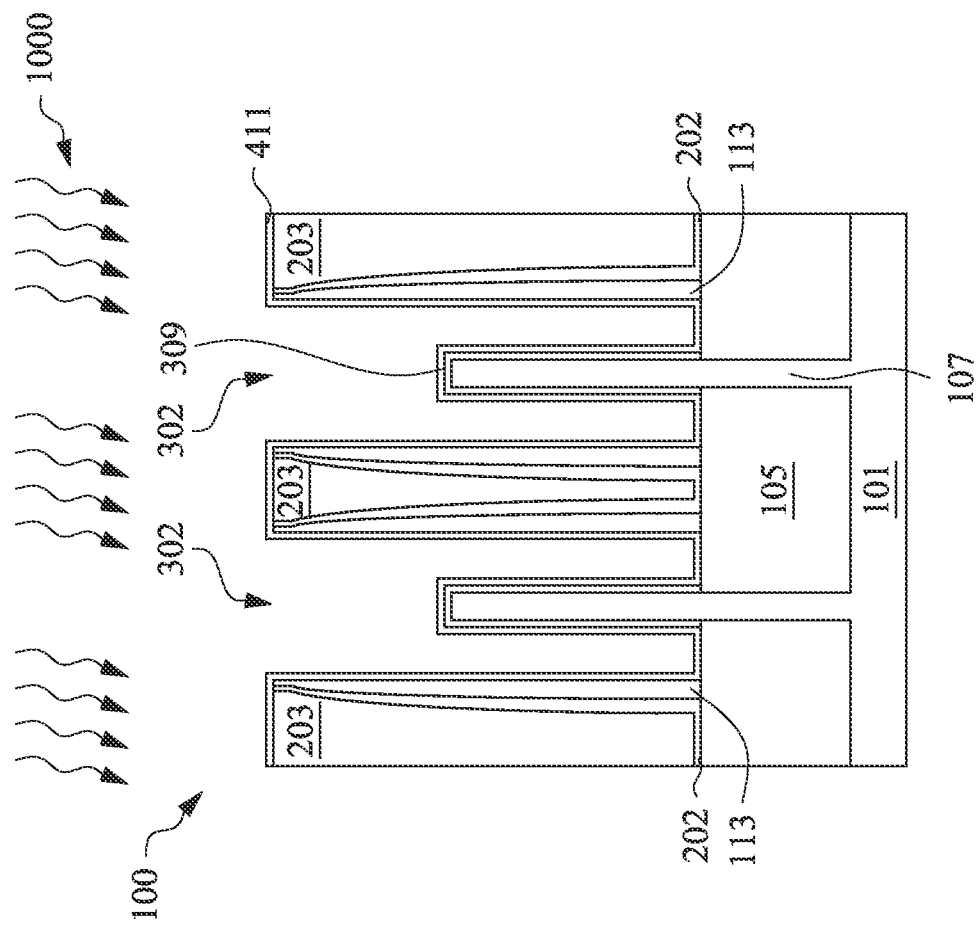

FIG. 10 illustrates an etching process 1000 used, once the diffusion anneal process 900 has been completed, to remove the remaining materials of the dopant film 215 and the buffer layer 213 and to expose the doped gate dielectric layer 411, according to some embodiments. The etching process 1000 may comprise a wet etch using a solution, a dry etch using a plasma, combinations thereof, or the like. However, any suitable etching process and any suitable solutions or plasmas may be utilized.

Figure 11A:
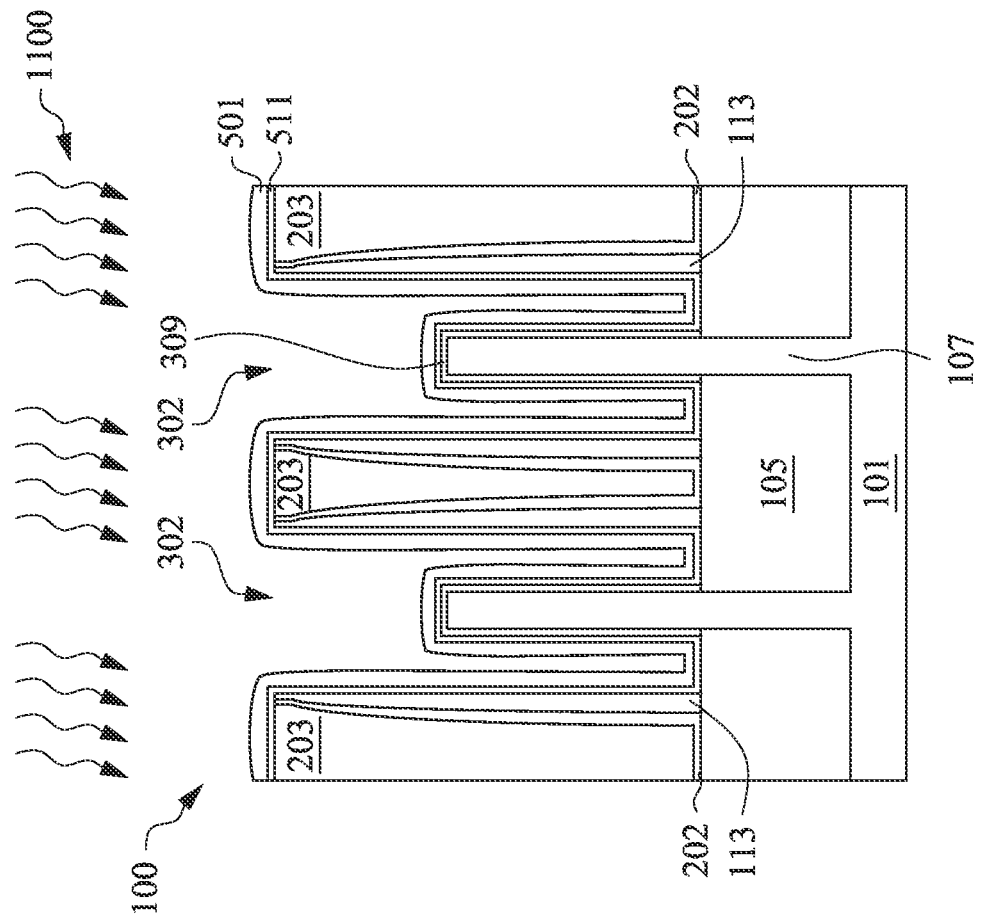

FIG. 11A illustrates a deposition of a capping layer 501 followed by a post-cap anneal process 1100 (e.g., crystallization anneal) of the doped gate dielectric layer 411. Once the doped gate dielectric layer 411 has been exposed, the capping layer 501 may be deposited as a single layer or as a multi-layer thin film over the doped gate dielectric layer 411 of the semiconductor device 100 using one or more materials including metals such as TiN, TaN, or W; metalloids such as amorphous silicon (a-Si); high-K dielectrics such as $Al_2O_3$, $ZrO_2$, and $TiO_2$; compounds thereof, or the like. The capping layer 501 may be deposited through a process such as atomic layer deposition (ALD), or the like to a thickness of between about 10 Å and about 50 Å. As such, the capping layer 501 conforms to the complex surfaces of the doped gate dielectric layer 411 within the openings 302 over the channel regions of the fins 107 and conforms to the planar surfaces of the doped gate dielectric layer 411 outside of the openings 302 and over the source/drain regions of the fins 107 (not shown in the Y-cut illustrated in FIG. 11). However, any suitable material, any suitable deposition process, and any suitable thickness may be utilized for the capping layer 501.

Additionally, in order to prevent the doped gate dielectric layer 411 from crystallizing prematurely, the deposition process of the capping layer 501 is kept at a temperature low enough to ensure that the crystallization, if any, is kept to a minimum. For example, in some embodiments the deposition process of the capping layer 501 is kept between about room temperature and about 450° C. However, any suitable temperature may be utilized.

FIG. 11A further illustrates a post-cap anneal process 1100 to transform the doped gate dielectric layer 411 (shown in FIG. 10) into a crystalline dielectric layer 511, in accordance with some embodiments. Once the capping layer 501 has been deposited over the doped gate dielectric layer 411, the post-cap anneal process 1100 may be used to crystallize the doped gate dielectric layer 411 into the crystalline dielectric layer 511. In some embodiments, the post-cap anneal process 1100 may be performed as a rapid thermal anneal (RTA) process at a temperature between about 700° C. and about 1000° C., such as about 850° C. for a period of less than about 1.0 sec, such as about 0.5 sec. However, any suitable temperatures and any suitable periods may be used to perform the post-cap anneal process 1100.

The capping layer 501 (to provide mechanical stress), the post-cap anneal process 1100 (to provide thermal energy), and the presence of the dopants (e.g., zirconium), collectively work together to transition those portions of the doped gate dielectric layer 411 that comprise the dopants from a first crystalline phase (e.g., an as-deposited high-temperature tetragonal crystalline phase) to a second crystalline phase (e.g., high-pressure orthorhombic crystalline phase). However, the different concentrations of dopants within the first doped region 951, the second doped region 952, and the third doped region 953 will cause a different amount of crystallization to occur in each of the different regions, and will also cause the second crystalline phase to extend into the doped gate dielectric layer 411 to different depths based on the depth profile of the dopants.

In some embodiments, those portions of the doped gate dielectric layer 411 may be transitioned to a crystalline film comprising a plurality of sections with different crystalline phases (e.g., tetragonal, cubic, orthorhombic, rhombohedral, and the like), depending upon the level of doping. However, any suitable crystalline phases may be utilized for the first and second crystalline phases.

For example, in an embodiment in which the gate dielectric layer 211 is initially deposited as hafnium oxide ($HfO_2$) and subsequently doped by zirconium, the amount of crystallization within each portion of the crystalline dielectric layer 511 will be at least in part dependent upon the amount of dopants that were present within that portion of the doped gate dielectric layer 411. In portions where there is a higher concentration of dopants, there will be a higher degree of crystallization, while in portions where there is a lower concentration of dopants, there will be a lower degree of crystallization.

For example, within the first doped region 951 region (see FIG. 9B), the crystalline dielectric layer 511 has a crystallinity that is a majority orthorhombic phase, such as being between about 70% and about 100%, such as about 90%. However, the second doped region 952 (see FIG. 9B), which has a lower doping concentration, will have a lower percentage of the orthorhombic phase, such as being between about 40% and about 70%, such as about 50%. Finally, the third doped region 953 (see FIG. 9B) has an even lower percentage of the orthorhombic phase, such as being between about 10% and about 40%, such as about 20%. Accordingly, because there is a dopant concentration gradient present within the doped gate dielectric layer 411, there will also be a crystallization gradient present within the crystalline dielectric layer 511.

By creating a crystallization gradient within the crystalline dielectric layer 511 (e.g., monocrystalline film or a polycrystalline film), there will also be differences in the ferroelectric properties (such as coercivity (Ec—e.g., the ability to withstand an external electric field without becoming depolarized) and/or remanent polarization (Pr)) of the crystalline dielectric layer 511, creating a first ferroelectric property depth profile. The first ferroelectric depth profile may be a gradient and may be within discrete ranges or contiguous ranges. In some embodiments the crystalline dielectric layer 511 may be formed as a gate dielectric with a first ferroelectric depth profile with a continuous gradient from a strongest ferroelectric property (e.g., $C_{fe1}$) at the top of the fins 107 to a weakest ferroelectric property (e.g., $C_{feN}$) at the bottom of the fins 107. As such, the ferroelectric depth profile acts as a parallel ferroelectric layer between the channel and metal gate and induces multiple ferroelectric remanent polarizations and multiple ferroelectric coercive fields (multi-$P_r/E_c$) within a ferroelectric transistor.

For example, in the embodiment in which the gate dielectric layer 211 is initially deposited as hafnium oxide ($HfO_2$) and subsequently doped by zirconium, the first doped region 951 of the crystalline dielectric layer 511 has a coercivity (Ec) that is between about 1 MV/cm and about 3 MV/cm, such as about 2 MV/cm. However, the second doped region 952 (see FIG. 9B), which has a different crystallinity, will have a different coercivity (Ec), such as being between about 0.5 MV/cm and about 1 MV/cm, such as about 0.8 MV/cm. Finally, the third doped region 953 (see FIG. 9B), which has yet another different crystallinity, may have a coercivity (Ec) of between about 0.1 MV/cm and about 0.5 MV/cm, such as about 0.2 MV/cm. However, any suitable parameters may be utilized.

By utilizing the concentration gradients to form crystallinity gradients, a distributed coercive field (Ec) can be obtained through non-uniform doping in the material of the gate dielectric (e.g., hafnium oxide) of a finFET device. In embodiments which utilize hafnium oxide ferroelectrics, the coercive field (Ec) may range between about 0.1 MV/cm to about 5 MV/cm, such as about 1 MV/cm, depending on the doping species and doping levels. By having a distributed Ec within a single transistor, the threshold voltage (Vt) can be continuously changed with the applied field, instead of a discrete change in the threshold voltage (Vt) when there is only a fixed coercive field value.

Furthermore, a distributed remnant polarization (Pr) can be obtained through non-uniform doping in the material of the gate dielectric of the finFET device. According to some embodiments, the remnant polarization (Pr) of the first region 951 is greater than the remnant polarization (Pr) of the second region 952 and the remnant polarization (Pr) of the second region 952 is greater than the remnant polarization (Pr) of the third region 953. For example, in embodiments which utilize hafnium oxide ferroelectrics, the remnant polarization (Pr) may range between about between about 1.0 $\mu C/cm^2$ and about 20.0 $\mu C/cm^2$, depending on the doping species and doping level. For example, the first region 951 may have a remnant polarization (Pr) of between about 5 $\mu C/cm^2$ and about 20 $\mu C/cm^2$, the second region 952 may have a remnant polarization (Pr) of between about 2 $\mu C/cm^2$ and about 5 $\mu C/cm^2$, and the third region 953 may have a remnant polarization (Pr) of between about 1 $\mu C/cm^2$ and about 2 $\mu C/cm^2$.

Figure 11B:
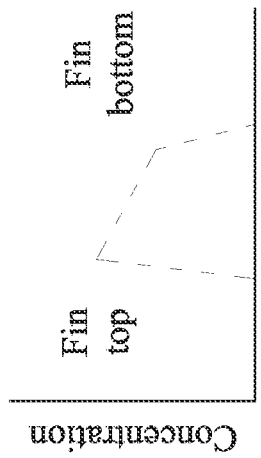
Figure 11D:
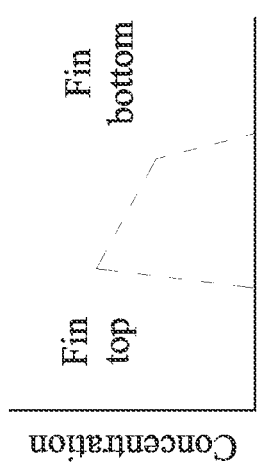
Figure 11C:
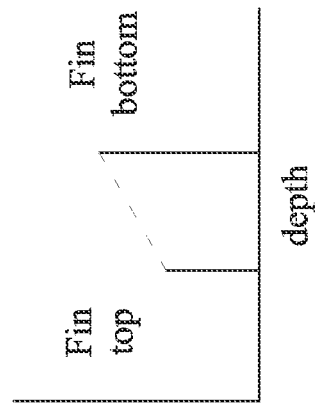

FIGS. 11B and 11C illustrate one embodiment in which the coercive field may be modified utilizing the concentration gradient along with the subsequent crystallization. FIG. 11B illustrates a concentration gradient from a position adjacent to a top of the fins 107 and, as can be seen, the dopant elements have a concentration gradient and the concentration decreases as a depth from the top of the fins 107 increases. From this concentration gradient, and along with the subsequent crystallization, FIG. 11C illustrates one corresponding coercive field gradient, which in this embodiment the coercive field decreases as the depth from the top of the fins 107 increases.

Figure 11E:
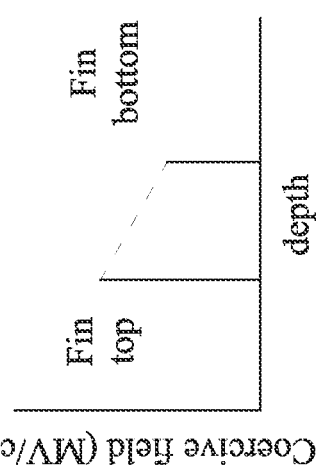

FIGS. 11D and 11E illustrate another embodiment in which the coercive field may be modified utilizing the concentration gradient along with the subsequent crystallization. FIG. 11D illustrates a concentration gradient from a position adjacent to a top of the fins 107 and, as can be seen, the dopant elements have a concentration gradient and the concentration decreases as a depth from the top of the fins 107 increases. However, in this embodiment, and as illustrated in FIG. 11E, the corresponding coercive field gradient can be tuned to increase the coercive field as the depth from the top of the fins 107 increases. Any suitable tuning such that the coercive fields have gradients along the length of the fins 107 may be utilized, and all such tunings are fully intended to be included within the scope of the embodiments.

Furthermore, the remnant polarization (Pr) may also be modified utilizing the concentration gradient along with the subsequent crystallization based on the dopant concentrations and the dopant species. According to some embodiments, a remnant polarization (Pr) gradient can be tuned to decrease from the top of the fins 107 as the depth from the top of the fins 107 increases. In other embodiments, remnant polarization (Pr) gradient can be tuned to increase as the depth from the top of the fins 107 increases. Any suitable tuning such that the remnant polarizations (Pr) have gradients along the length of the fins 107 may be utilized, and all such tunings are fully intended to be included within the scope of the embodiments.

Figure 12:
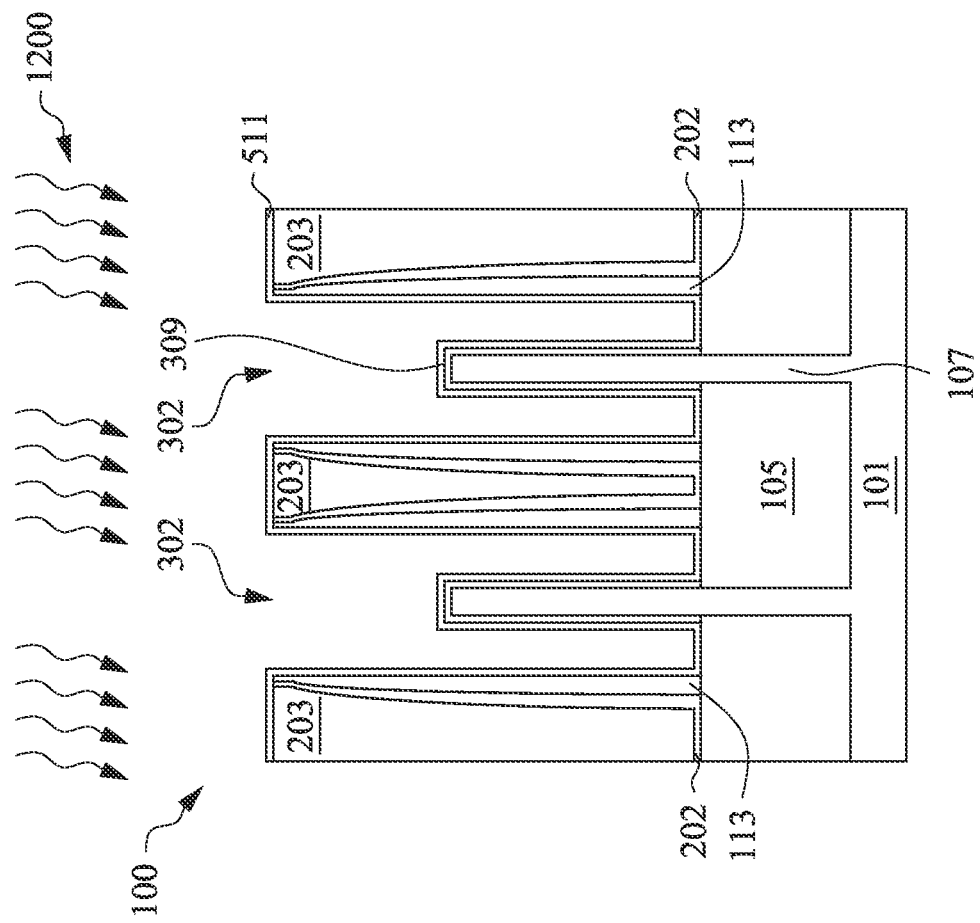

FIG. 12 illustrates an optional etching process 1200 used, after the post-cap anneal process 1100 has been performed, to remove the capping layer 501 and to expose the crystalline dielectric layer 511, according to some embodiments. In other embodiments the capping layer 501 may be left in place without being removed. The etching process 1200 may comprise one or more wet etches, dry etches, combinations thereof, or the like. However, any suitable etching processes, any suitable solutions and/or any suitable plasma may be utilized.

Figure 13:
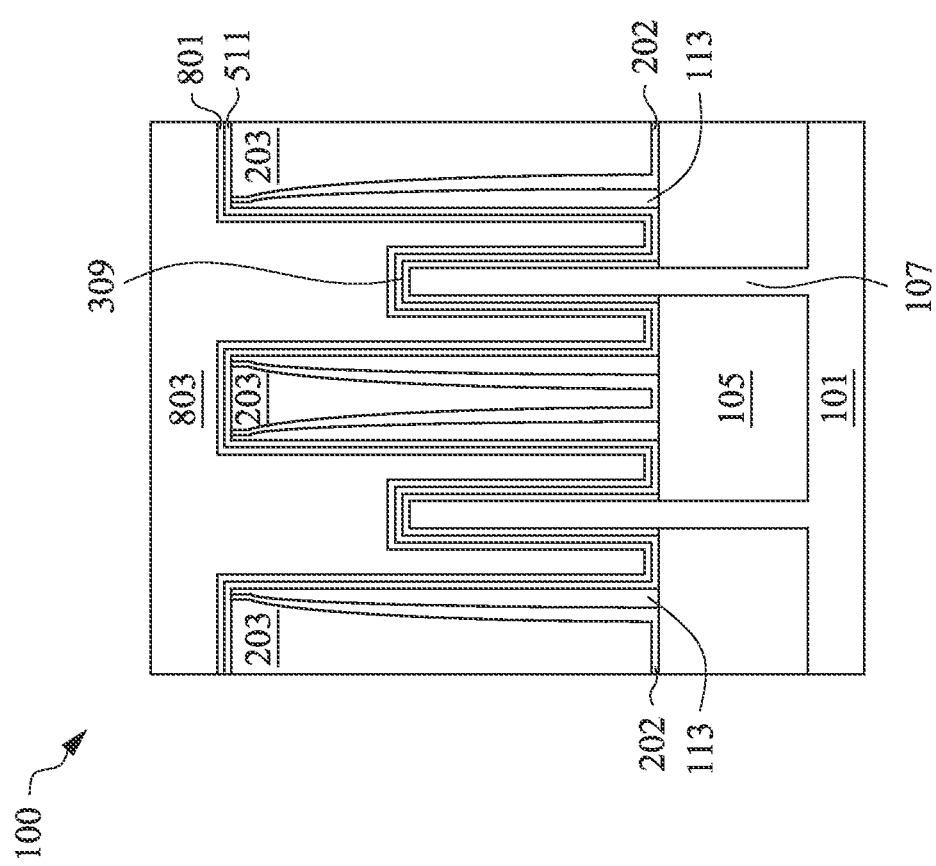

FIG. 13 illustrates the formation of metal gate electrode structures in accordance with some embodiments. Once the capping layer 501 has been removed, a series of metal layers may be deposited over the crystalline dielectric layer 511. According to some embodiments, a metal gate barrier layer 801 may be formed adjacent to the crystalline dielectric layer 511 and may be formed from a first metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The material of the metal gate barrier layer 801 may be deposited using a deposition process such as atomic layer deposition, chemical vapor deposition, sputtering, or the like, to a thickness of between about 5 Å and about 200 Å, although any suitable deposition process or thickness may be used.

FIG. 13 further illustrates the deposition of a work function metal layer 803 that fills a remainder of the openings 302 left behind by the removal of the dummy gate electrodes 111. In an embodiment the work function metal layer 803 is a metallic material such as W, Al, Cu, AlCu, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the openings 302. In a particular embodiment, the work function metal layer 803 may be deposited to fill and or overfill the openings 302, although any suitable material, deposition process, and height may be utilized.

FIGS. 14A-14D illustrate a planarization process for removing excess materials from the structure of FIG. 13, according to some embodiments. Once the work function metal layer 803 has been deposited, gate stacks 815 may be formed by planarizing the materials overfilling the openings 302 to remove any excess materials. In some embodiments, the planarization is performed using a chemical mechanical polishing (CMP) process, although any suitable material, deposition process, and height may be utilized.

Figure 14B:
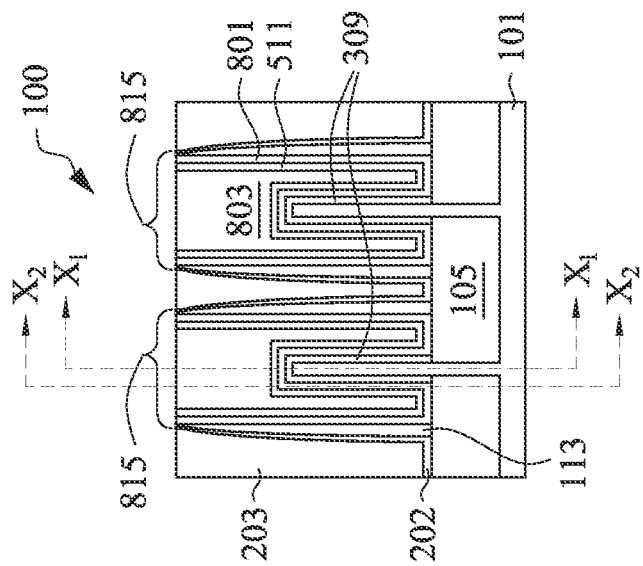
Figure 14A:
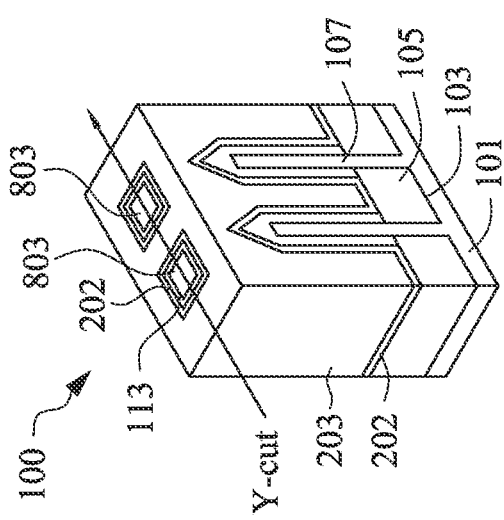
Figure 14D:
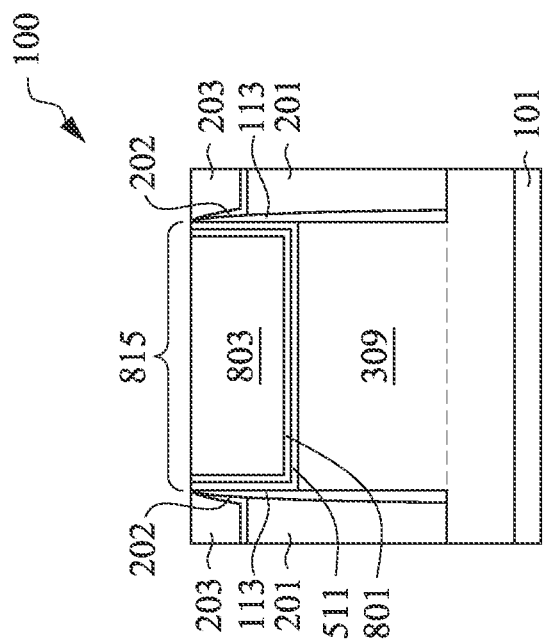
Figure 14C:
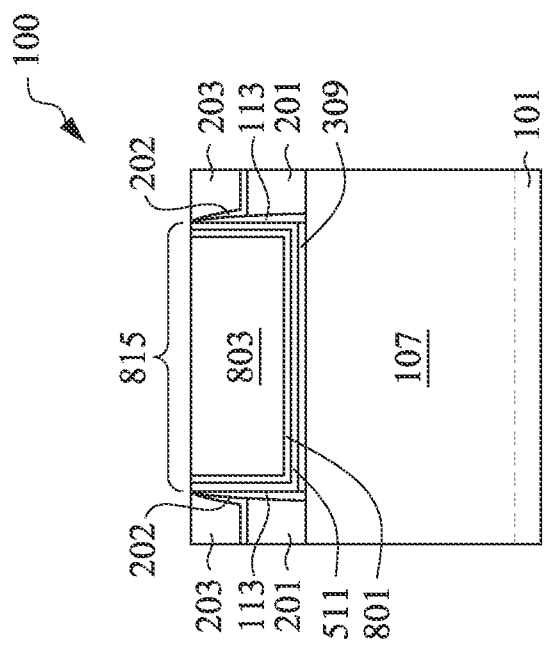
Figure 14E:
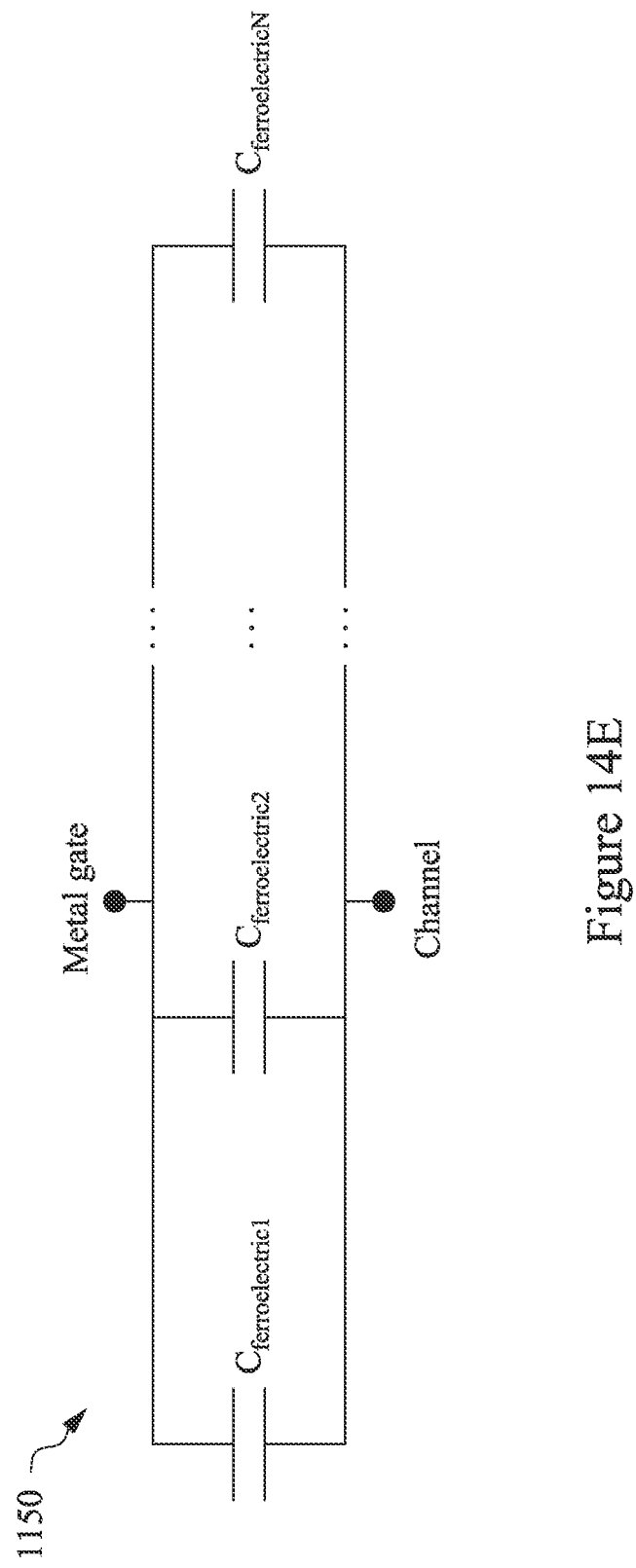

Furthermore, the ferroelectric depth profile of the crystalline dielectric layer 511 is based in part on the dopant concentration profiles of the doped gate dielectric layer 411 and the process conditions used for the post-cap anneal process 1100. FIG. 14E illustrates an equivalent circuit 1150 of the ferroelectric depth profile of the crystalline dielectric layer 511. The equivalent circuit 1150 comprises a plurality of capacitors ($C_{ferroelectric1}$, $C_{ferroelectric2}$ ... $C_{ferrolectricN}$) connected in parallel between the metal gate and the channel. The capacitance of the plurality of capacitors is a function of the differences in ferroelectric properties (which is itself dependent upon the dopant concentration and degree of crystallization) in the crystalline dielectric layer 511. For example, in an embodiment wherein the crystalline dielectric layer 511 comprises hafnium oxide ($HfO_2$) doped with zirconium (Zr), the dopant concentration may have the stoichiometric formula $Hf_{(1-x)}Zr_xO_2$, where $Zr_x$ represents a ratio of atoms of the dopant element (e.g., Zr) driven into the hafnium oxide ($HfO_2$) to the number of atoms of the hafnium element (Hf) of the hafnium oxide ($HfO_2$). Each of the capacitors is representative of the ferroelectric depth profile associated with different material compositions of the crystalline dielectric layer 511 at different depths along the fins 107. For example, the first capacitor $C_{ferroelectric1}$ may be representative of first ferroelectric properties ($P_{r1}/E_{c1}$) associated with a first material composition (e.g., $Hf_{0.5}Zr_{0.5}O_2$) of the crystalline dielectric layer 511, the second capacitor $C_{ferroelectric2}$ may be representative of second ferroelectric properties ($P_{r2}/E_{c2}$) associated with a second material composition (e.g., $Hf_{0.4}Zr_{0.6}O_2$) of the crystalline dielectric layer 511, ... and the $N^{th}$ capacitor $C_{ferroelectricN}$ may be representative of $N^{th}$ ferroelectric properties ($P_{rN}/E_{cN}$) associated with an $N^{th}$ material composition (e.g., $Hf_{0.1}Zr_{0.9}O_2$) of the crystalline dielectric layer 511.

As can be seen, the differences in crystallization and dopant concentrations will lead to a difference in capacitance between the channel and the work function metal layer 803 along the height of the fin 107. Such a difference can be utilized to tune the overall capacitance or even to utilize the different capacitances independent of each other.

By creating ferroelectric depth profiles, the ferroelectric transistor has the potential for use in neuromorphic applications and can be integrated at the N3 node and beyond. As such, the ferroelectric transistor has the potential for use in neuromorphic applications such as artificial intelligence using deep neural networks (DNN) for cognitive tasks (e.g., speech recognition, image recognition, image classification, language processing, and more). In fully connected DNN applications, significant acceleration in training can be achieved when minimizing data movement by utilizing on-chip storage and performing weight updates at the same node, where all the nodes are all connected together in an array. As such, computation is mapped to vector-matrix or matrix-matrix multiplication and dense analog synaptic memory arrays perform MACs and update at the location of the data. The ferroelectric transistor is applicable in synaptic memory applications which need to be high density, low latency, energy efficient and capable of preserving high network accuracies with symmetry ($G_{max}/G_{min}$<10) and operable with a small program pulse width (e.g., <10 ms).

Figure 15C:
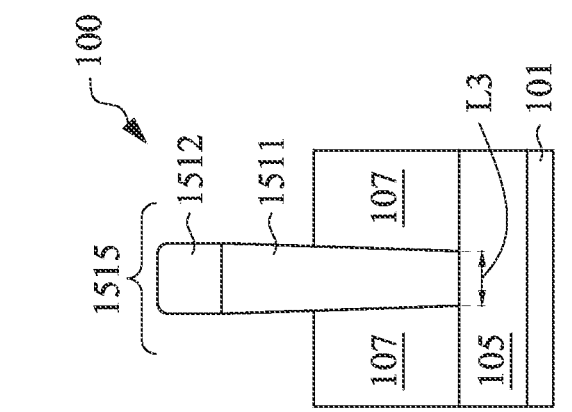
Figure 15B:
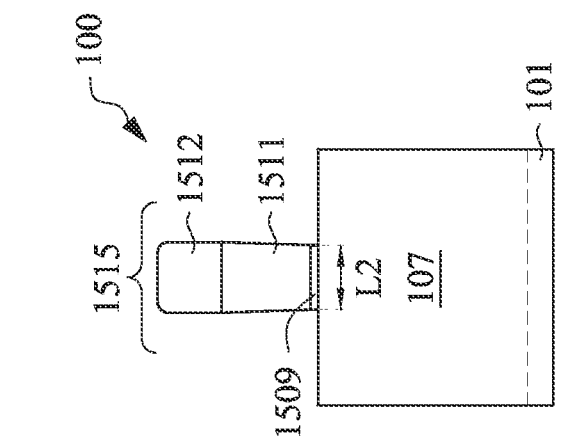
Figure 15A:
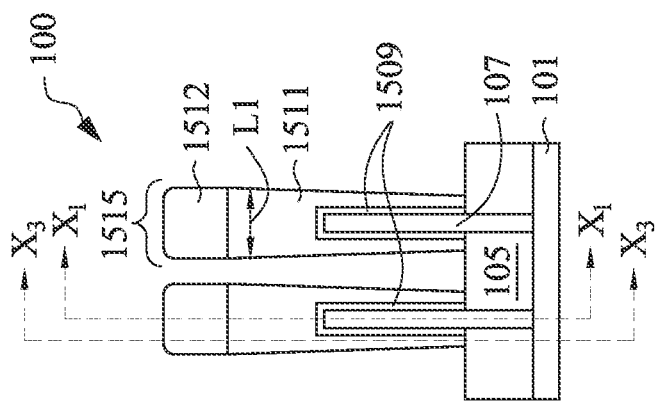

With reference now to FIGS. 15A-15C, according to another embodiment in which the shape of the work function metal layer 803 is tuned, these figures illustrate the formation of tapered dummy gate stacks 1515. The tapered dummy gate stacks 1515 comprise similar features to those of the dummy gate stacks 115 of FIGS. 3A-3D and are formed using any of the materials and processes suitable for forming the dummy gate stacks 115 of FIGS. 3A-3D, as set forth above. The tapered dummy gate stacks 1515 differ from the dummy gate stacks 115 in that the tapered dummy gate stacks 1515 comprise tapered sidewall profiles, whereas the dummy gate stacks 115 comprise vertical sidewall profiles.

In particular, FIG. 15A illustrates a cross-sectional (Y-cut) view of the intermediate step similar to that illustrated in FIG. 3B. However, during the patterning of the tapered dummy gate stacks 1515, the tapered dummy gate stack 1515 is etched such that the tapered dummy gate stack 1515 has a tapered shape. For example, in one embodiment in which the tapered dummy gate stack 1515 is etched using a dry etching process, the dry etching process may be tuned to form the tapered shape.

By using these etching parameters, the tapered dummy gate stacks 1515 may have a first length L1 between the tapered gate masks 1512 and the tapered dummy gate electrodes 1511 of between about 10 nm and about 12 nm, such as about 11 nm. Additionally, the tapered dummy gate stacks 1515 may have a second length L2 at an interface between the tapered dummy gate electrodes 1511 and the tapered dummy gate dielectric 1509 of between about 12 nm and about 14 nm, such as about 13 nm, and may also have a third length L3 at an interface between the tapered dummy gate electrodes 1511 and the first isolation regions 105 of between about 14 nm and about 16 nm, such as about 15 nm. However, any suitable dimensions may be utilized.

Figure 16B:
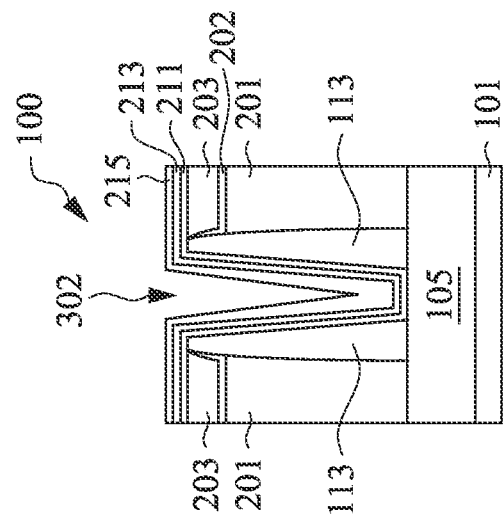
Figure 16A:
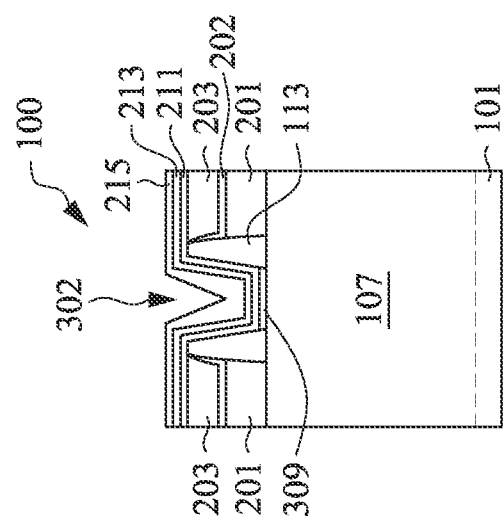

With reference now to FIGS. 16A-16C, these figures illustrate the formation of the spacers 113 with angled sidewalls within the openings 302. FIGS. 16A-16C further illustrate the formation of the source/drain regions 201, the CESL 202, the ILD layer 203, the openings 302 and the interfacial layer 309. The items formed in FIGS. 16A-16C are formed using the tapered dummy gate stacks 1515 of FIGS. 15A-15C and using any of the materials and processes disclosed above with regard to FIGS. 4A-4D to FIGS. 7A-7D.

FIGS. 16A-16C further illustrate the deposition of the gate dielectric layer 211, the buffer layer 213, and the dopant film 215 over the surfaces within the openings 302. The gate dielectric layer 211, the buffer layer 213, and the dopant film 215 illustrated in FIGS. 16A-16C may be formed using any of the materials and processes suitable for forming these layers as set forth above with regard to FIG. 8. However, because the tapered shape has a smaller width at the bottom of the openings 302 than at a top of the openings 302, the deposition of the gate dielectric layer 211 and the buffer layer 213 will take up most of the room along the bottom of the openings 302, thereby displacing the subsequently deposited dopant film 215 further away from a bottom of the fins 107.

In such embodiments, during the diffusion anneal process 900, the dopant elements of the buffer layer 213 and the dopant film 215 are driven into the gate dielectric layer 211 such that a concentration gradient reverses as the fin gate dielectric layer 211 extends from a bottom of the fin 107 towards a top of the fin 107. In particular, at a bottom of the fin 107, where the dopant film 215 has been displaced, there is a relatively small, if any concentration of the dopants, which concentration increases as the dopant film 215 gains thickness, and then decreases again towards a top of the fin 107 wherein the dopant film 215 decreases in thickness.

As an example, in this embodiment, the first doped region 951 (see FIG. 9B) after the diffusion anneal process 900 comprises a first dopant concentration with an atomic percentage (at. %) of between about 10 at. % and about 20 at. %, such as about 15 at. %; the second doped region 952 has a second dopant concentration has an atomic percentage (at. %) of between about 5 at. % and about 10 at. %, such as about 7 at. %; and the third doped region 953 has a third dopant concentration being between about 1 at. % and about 5 at. %, such as about 3 at. %. However, any suitable dopant concentrations and any suitable ranges may be utilized.

FIG. 16D illustrates a concentration versus depth chart for the gate dielectric layer 211 through the arrow 1601 (see FIG. 16C) after the dopants have been driven into the gate dielectric layer 211. As can be seen, the concentration is at a maximum at a top of the gate dielectric layer 211 and has a gradient, going down as the depth increases.

Figure 17A:
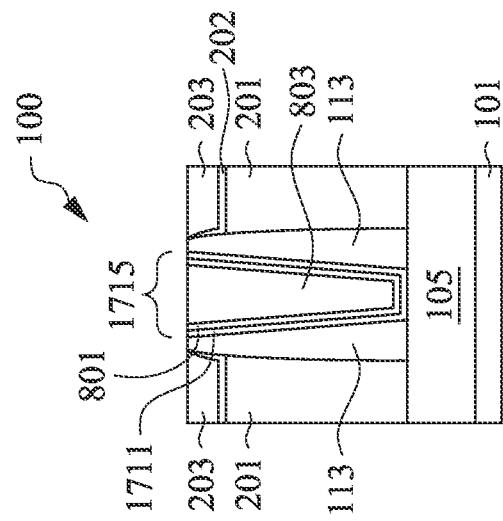
Figure 17B:
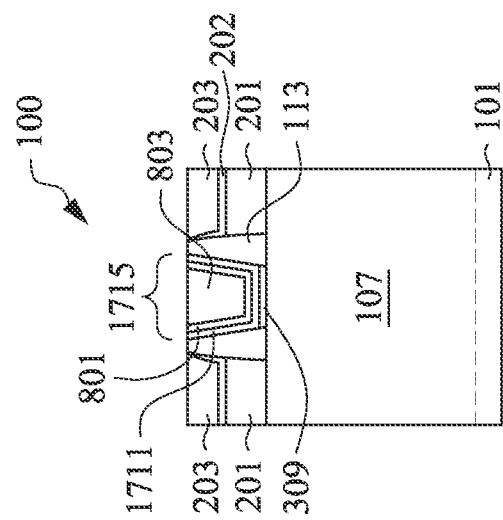

With reference now to FIGS. 17A and 17B, these figures illustrate, according to some embodiments, the formation of tapered gate stacks 1715. The tapered gate stacks 1715 comprise similar features to those of the gate stacks 815 of FIGS. 14A-14D and are formed using any of the materials and processes suitable for forming the gate stacks 815 as set forth above. The tapered crystalline dielectric layer 1711 is formed during the post-cap anneal process 1100 using any of the materials and processes set forth above with regard to FIG. 11 and FIG. 12.

For example, within the first doped region 951 region (see FIG. 9B), the tapered crystalline dielectric layer 1711 has a crystallinity that is a majority orthorhombic phase. However, the second doped region 952 (see FIG. 9B), which has a different doping concentration, will have a different percentage of the orthorhombic phase. Finally, the third doped region 953 (see FIG. 9B) will have another different percentage of the orthorhombic phase.

Additionally, in the embodiment in which the gate dielectric layer 211 is initially deposited as hafnium oxide ($HfO_2$) and subsequently doped by zirconium, the first doped region 951 (see FIG. 9B) of the tapered crystalline dielectric layer 1711 has a first coercivity (Ec) and/or a first remnant polarization (Pr). However, the second doped region 952 (see FIG. 9B), which has a different crystallinity, will have a second coercivity (Ec) and/or a second remnant polarization (Pr) that is different from the first coercivity (Ec) and/or the first remnant polarization (Pr). Finally, the third doped region 953 (see FIG. 9B) has still another crystallinity, will have a third coercivity (Ec) and/or a third remnant polarization (Pr) that is different from the first and second coercivities (Ec) and/or the first and second remnant polarizations (Pr). However, any suitable parameters may be utilized.

FIGS. 17A and 17B further illustrate the formation of the metal gate barrier layer 801 and the work function metal layer 803 formed with tapered profiles. The metal gate barrier layer 801 and the work function metal layer 803 may be formed with the tapered profiles using any of the materials and any of the processes suitable for depositing the metal gate barrier layer 801 and the work function metal layer 803 as set forth above with regard to FIG. 12. Once the metal gate barrier layer 801 and the work function metal layer 803 have been deposited, the tapered gate stacks 1715 may be formed by performing a suitable planarization process (e.g., CMP) to remove any excess materials as set forth above with regard to FIGS. 14A-14D.

Figure 18C:
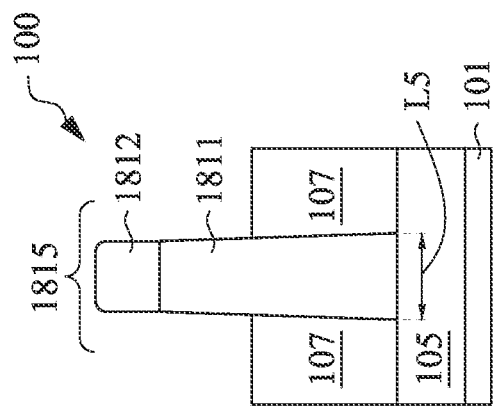
FIGS. 18A-18C, 19A-19C, and 20A-20B illustrate intermediate steps in forming necking gate stacks of a semiconductor device comprising a ferroelectric gate dielectric layer, according to another embodiment.
Figure 18B:
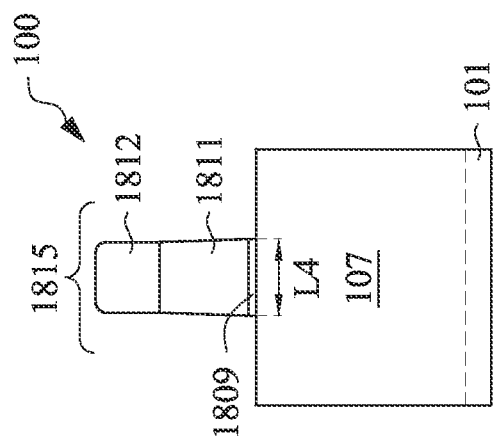
Figure 18A:
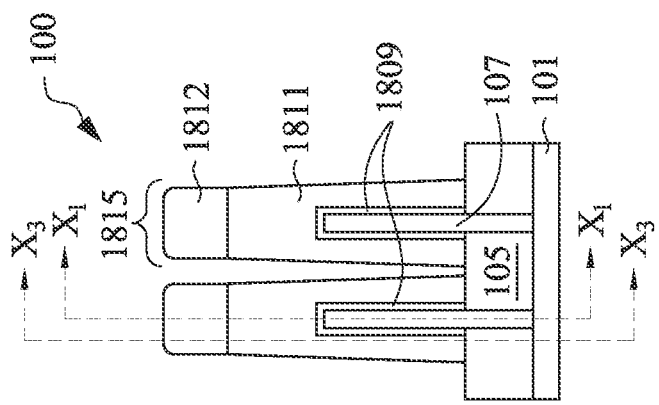

With reference now to FIGS. 18A-18C, according to another embodiment in which the shape of the gate masks and the dummy gate electrodes are tuned to have a tapered sidewall. In these embodiments, however, the sidewalls are tapered outwards to form necking dummy gate stacks 1815 comprising necking gate masks 1812 and necking dummy gate electrodes 1811. The necking dummy gate stacks 1815 comprise similar features to those of the dummy gate stacks 115 of FIGS. 3A-3D and are formed using any of the materials and processes suitable for forming the dummy gate stacks 115 of FIGS. 3A-3D, as set forth above. The necking dummy gate stacks 1815 differ from the dummy gate stacks 115 in that the necking dummy gate stacks 1815 comprise necking sidewall profiles that expand outwards from top to bottom, whereas the dummy gate stacks 115 comprise vertical sidewall profiles.

In particular, FIG. 18A illustrates a cross-sectional (Y-cut) view of the intermediate step similar to that illustrated in FIG. 3B. However, during the patterning of the necking dummy gate stacks 1815, the necking dummy gate stacks 1815 is etched such that the necking dummy gate stacks 1815 has an outwardly tapered shape. For example, in one embodiment in which the necking dummy gate stacks 1815 is etched using a dry etching process, the dry etching process may be tuned to form the outwardly tapered shape.

By using these etching parameters, the necking dummy gate stacks 1815 may have a fourth length L4 at an interface between the tapered dummy gate electrodes 1811 and the tapered dummy gate dielectric 1809 at the top of the fins 107 and may also have a fifth length L5 at an interface between the tapered dummy gate electrodes 1811 and the first isolation regions 105. However, any suitable dimensions may be utilized.

Figure 19B:
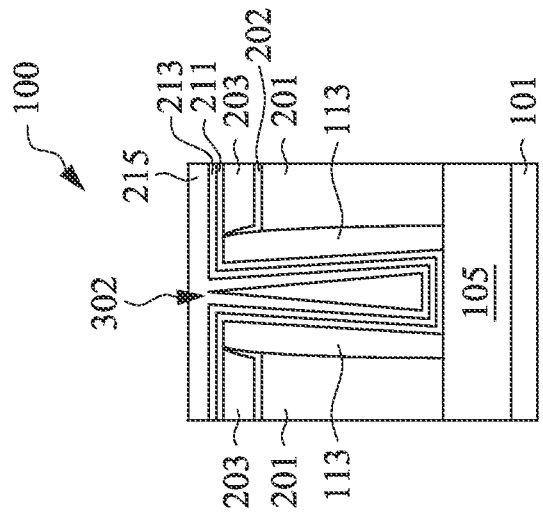
Figure 19A:
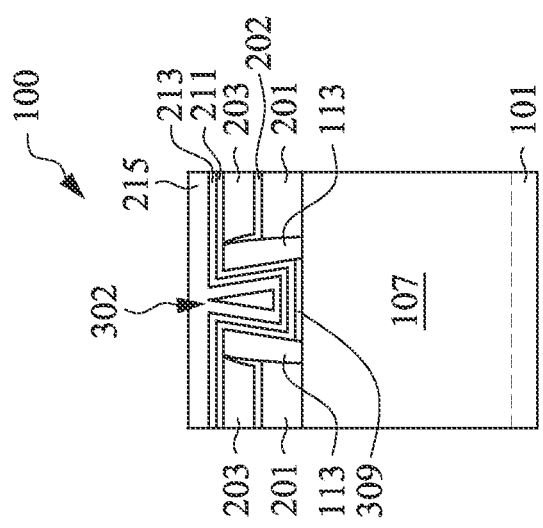
Figure 19C:
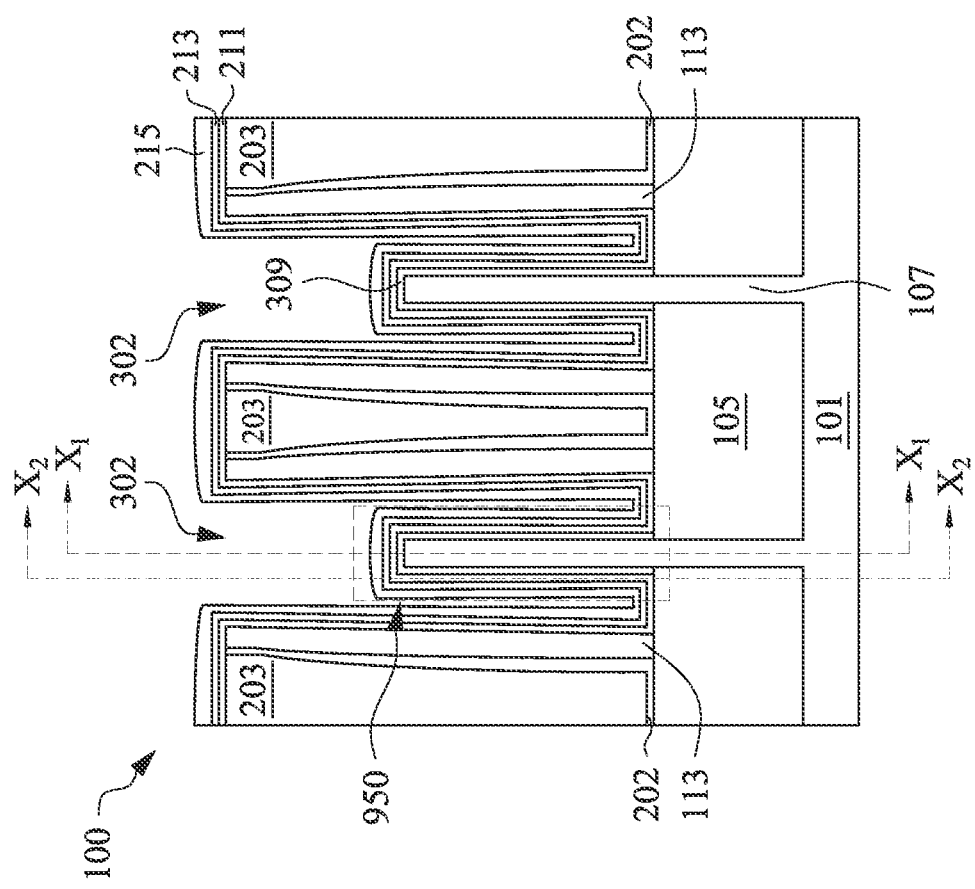

With reference now to FIGS. 19A-19C, these figures illustrate the formation of the spacers 113 having the necking gate profile and further illustrate the formation of the source/drain regions 201, the CESL 202, the ILD layer 203, and the interfacial layer 309, as described above. The items formed in FIGS. 19A-19C may be formed using any of the materials and processes disclosed above with regard to FIGS. 4A-4D to FIGS. 7A-7D.

FIGS. 19A-19C further illustrate the deposition of the gate dielectric layer 211, the buffer layer 213, and the dopant film 215 over the exposed complex surfaces within the openings 302. The gate dielectric layer 211, the buffer layer 213, and the dopant film 215 illustrated in FIGS. 19A-19C may be formed using any of the materials and processes suitable for forming these layers as set forth above with regard to FIG. 8. Due to the shape of the openings 302, the gate dielectric layer 211, the buffer layer 213, and the dopant film 215 are formed with angled sidewalls and third thickness distributions with a thinner distribution near the bottom of the openings 302 and a thicker distribution near the top of the openings 302, with the dopant film 215 actually sealing the openings 302 with a void still present.

Additionally, during the diffusion anneal process 900, the dopant elements of the buffer layer 213 and the dopant film 215 are driven into the gate dielectric layer 211. In an embodiment, the first doped region 951 (see FIG. 9B) after the diffusion anneal process 900 in this embodiment comprises a first dopant concentration with a first atomic percentage (at. %); the second doped region 952 has a second dopant concentration with a second atomic percentage (at. %); and the third doped region 953 has a third dopant concentration with a third atomic percentage (at. %). According to some embodiments, the first, second and third dopant concentrations are different from one another. For example, in some embodiments, the first dopant concentration is greater than the second dopant concentration and the second dopant concentration is greater than the third dopant concentration. In other embodiments, two or more of the first, second and third dopant concentrations may be the same. For example, in some embodiments, the first dopant concentration is greater than the second and third dopant concentrations and the second and third dopant concentrations substantially equal concentrations. However, any suitable dopant concentrations and any suitable ranges may be utilized.

Figure 20B:
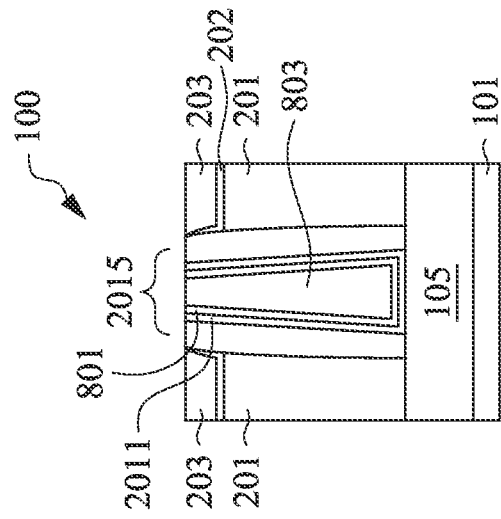
Figure 20A:
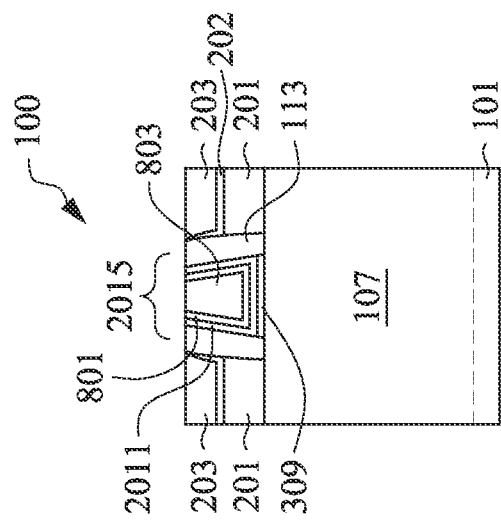

With reference now to FIGS. 20A and 20B, these figures illustrate, according to some embodiments, the formation of necking gate stacks 2015. The necking gate stacks 2015 comprise similar features to those of the gate stacks 815 of FIGS. 14A-14D and are formed using any of the materials and processes suitable for forming the gate stacks 815 as set forth above. The necking crystalline dielectric layer 2011 is formed during the post-cap anneal process 1100 using any of the materials and processes set forth above with regard to FIG. 11 and FIG. 12.

For example, within the first doped region 951 region (see FIG. 9B), the necking crystalline dielectric layer 2011 has a first crystallinity with a first percentage of the orthorhombic phase. However, the second doped region 952 (see FIG. 9B), which has a different doping concentration, will have a second crystallinity with a second percentage of the orthorhombic phase that is different from the first percentage. Finally, the third doped region 953 (see FIG. 9B) will have a third crystallinity with a third percentage of the orthorhombic phase that is different from the first and second percentages.

Additionally, in the embodiment in which the gate dielectric layer 211 is initially deposited as hafnium oxide ($HfO_2$) and subsequently doped by zirconium, the first doped region 951 (see FIG. 9B) of the necking gate stacks 2015 has a first coercivity. However, the second doped region 952 (see FIG. 9B), which has a different crystallinity from the first doped region 951, will have a second coercivity that is different from the first coercivity. Finally, the third doped region 953 (see FIG. 9B) has a third coercivity that is different from the first and second coercivities. However, any suitable parameters may be utilized.

FIGS. 20A and 20B further illustrate the formation of the metal gate barrier layer 801 and the work function metal layer 803. The metal gate barrier layer 801 and the work function metal layer 803 may be formed with the necking profiles using any of the materials and any of the processes suitable for depositing the metal gate barrier layer 801 and the work function metal layer 803 as set forth above with regard to FIG. 12. Once the metal gate barrier layer 801 and the work function metal layer 803 have been deposited, the necking gate stacks 2015 may be formed by performing a suitable planarization process (e.g., CMP) to remove any excess materials as set forth above with regard to FIGS. 14A-14D.

With reference now to FIGS. 21A-21C, according to still another embodiment, these figures illustrate the formation of bamboo dummy gate stacks 2115 as an intermediate step of forming the semiconductor device 100. The bamboo dummy gate stacks 2115 comprise similar features to those of the dummy gate stacks 115 of FIGS. 3A-3D and are formed using any of the materials and processes suitable for forming the dummy gate stacks 115 of FIGS. 3A-3D, as set forth above. The bamboo dummy gate stacks 2115 differ from the dummy gate stacks 115 in that the bamboo dummy gate stacks 2115 comprise bamboo gate masks 2112 and bamboo dummy gate electrodes 2111 having bamboo-shaped sidewall profiles that are vertical above the fins 107 and rounded between the tops of the fins 107 and the first isolation regions 105, whereas the dummy gate stacks 115 comprise vertical sidewall profiles.

In this embodiment, during the patterning of the bamboo dummy gate stacks 2115, the bamboo dummy gate stacks 2115 is etched such that the bamboo dummy gate stacks 2115 has the bamboo shape. For example, in one embodiment in which the bamboo dummy gate stacks 2115 is etched using a dry etching process, the dry etching process may be performed in multiple steps. In a first step, the dry etching process may be tuned to etch the straight portions. Once the straight portions of the bamboo dummy gate stacks 2115 have been etched, the dry etching parameters may be re-tuned to etch the remaining portions in order to obtain the bamboo shape. However, any suitable process may be utilized.

By using these etching parameters, the bamboo dummy gate stacks 2115 may have a sixth length L6 at an interface between the bamboo dummy gate electrodes 2111 and the bamboo dummy gate dielectric 2109 at the top of the fins 107, may also have a seventh length L7 at an interface between the bamboo dummy gate electrodes 2111 and the first isolation regions 105, and may have an eighth length L8 at an interface between the bamboo dummy gate electrodes 2111 and the first isolation regions 105. According to some embodiments, the seventh length L7 is greater than the sixth length L6 and the eighth length L8 and the eighth length L8 is about the same length as the sixth length L6. However, any suitable dimensions may be utilized.

Figure 22B:
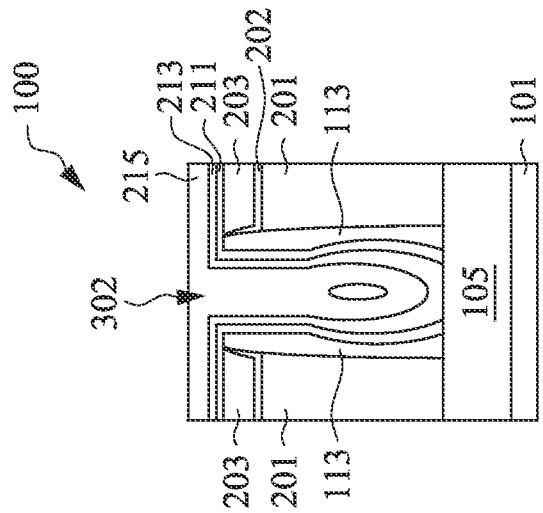
Figure 22A:
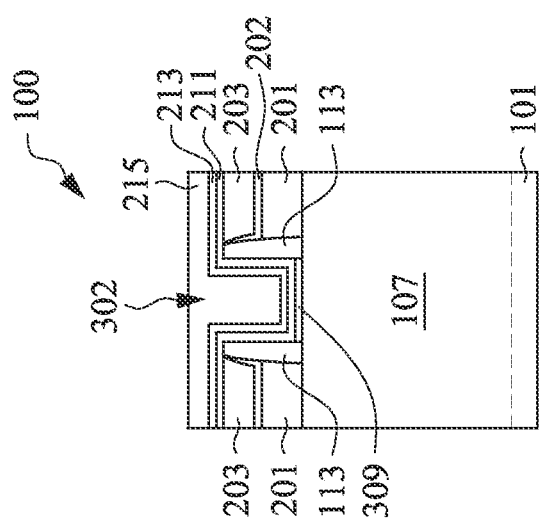

With reference now to FIGS. 22A-22C these figures illustrate the formation of the spacers 113, the source/drain regions 201, the CESL 202, the ILD layer 203, and the interfacial layer 309, as described above. The items formed in FIGS. 22A-22C may be formed using any of the materials and processes disclosed above with regard to FIGS. 4A-4D to FIGS. 7A-7D. FIGS. 22A-22C further illustrate the deposition of the gate dielectric layer 211, the buffer layer 213, and the dopant film 215 over the exposed complex surfaces within the openings 302. The gate dielectric layer 211, the buffer layer 213, and the dopant film 215 illustrated in FIGS. 22A-22C may be formed using any of the materials and processes suitable for forming these layers as set forth above with regard to FIG. 8A.

Additionally, during the diffusion anneal process 900, the dopant elements of the buffer layer 213 and the dopant film 215 are driven into the gate dielectric layer 211. In an embodiment, the first doped region 951 (see FIG. 9B) after the diffusion anneal process 900 in this embodiment comprises a first dopant concentration with a first atomic percentage (at. %); the second doped region 952 has a second dopant concentration with a second atomic percentage (at. %) that is different from the first atomic percentage; and the third doped region 953 has a third dopant concentration with a third atomic percentage (at. %) that is different from the first and second atomic percentages. However, any suitable dopant concentrations and any suitable ranges may be utilized.

Figure 23B:
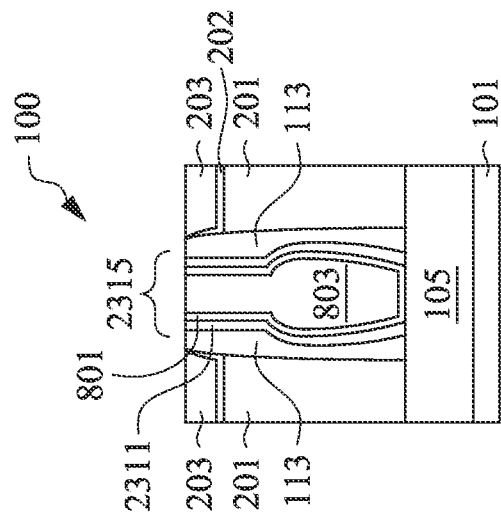
Figure 23A:
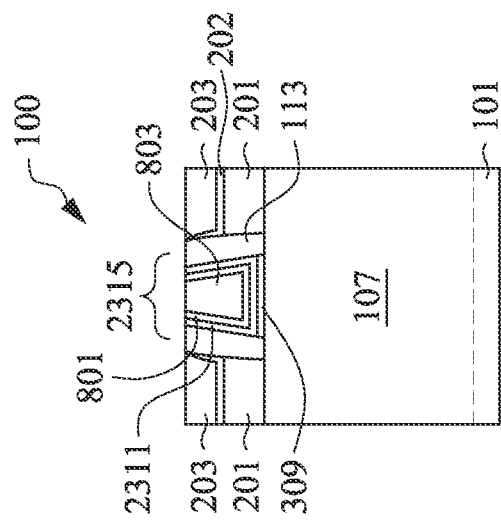

With reference now to FIGS. 23A and 23B, these figures illustrate, according to some embodiments, the formation of bamboo gate stacks 2315. The bamboo gate stacks 2315 comprise similar features to those of the gate stacks 815 of FIGS. 14A-14D and are formed using any of the materials and processes suitable for forming the gate stacks 815 as set forth above. The bamboo crystallized gate dielectric 2311 is formed during the post-cap anneal process 1100 using any of the materials and processes set forth above with regard to FIG. 11 and FIG. 12.

For example, within the first doped region 951 region (see FIG. 9B), the bamboo crystallized gate dielectric 2311 has a first crystallinity with a first percentage of the orthorhombic phase. However, the second doped region 952 (see FIG. 9B), which has a different doping concentration, will have a second crystallinity with a second percentage of the orthorhombic phase that is different from the first percentage. Finally, the third doped region 953 (see FIG. 9B) will have a third crystallinity with a third percentage of the orthorhombic phase that is different from the first and second percentages.

Additionally, in the embodiment in which the gate dielectric layer 211 is initially deposited as hafnium oxide ($HfO_2$) and subsequently doped by zirconium, the first doped region 951 (see FIG. 9B) of the bamboo crystallized gate dielectric 2311 has a first coercivity. However, the second doped region 952 (see FIG. 9B), which has a different crystallinity, will have a second coercivity that is different from the first coercivity. Finally, the third doped region 953 (see FIG. 9B) has a third coercivity that is different from the first and second coercivities. However, any suitable parameters may be utilized.

FIGS. 23A and 23B further illustrate the formation of the metal gate barrier layer 801 and the work function metal layer 803. The metal gate barrier layer 801 and the work function metal layer 803 may be formed with the tapered profiles using any of the materials and any of the processes suitable for depositing the metal gate barrier layer 801 and the work function metal layer 803 as set forth above with regard to FIG. 12. Once the metal gate barrier layer 801 and the work function metal layer 803 have been deposited, the bamboo crystallized gate dielectric 2311 may be formed by performing a suitable planarization process (e.g., CMP) to remove any excess materials as set forth above with regard to FIGS. 14A-14D.

Figure 23C:
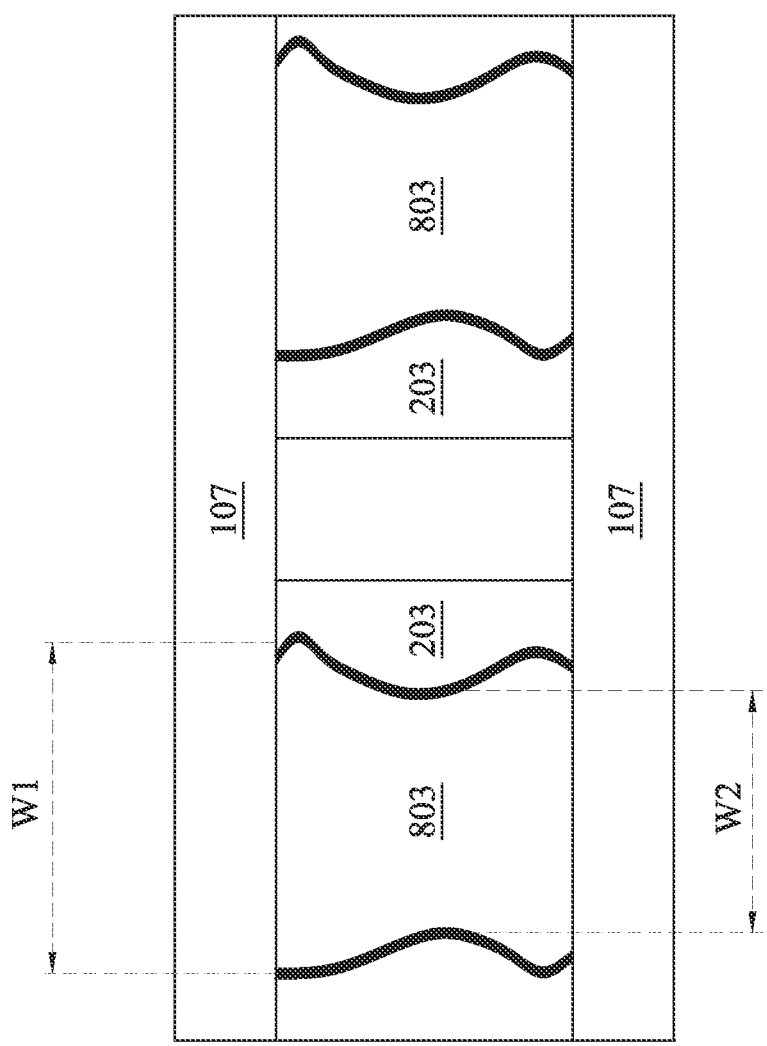

FIG. 23C illustrates a top-down view of the work function metal layer 803 in between two of the fins 107. In this view the bamboo shape of the work function metal layer 803 is clearly illustrated, as the etching processes have a harder time removing material from the corners. As such, the work function metal layer 803 has a larger width adjacent to the fins 107 than at a middle of the work function metal layer 803. For example, the work function metal layer 803 may have a first width W1 adjacent to a fin 107 of between about 4 nm and about 8 nm, such as about 6 nm, while the work function metal layer 803 may have a second width W2 in the middle of between about 2 nm and about 4 nm, such as about 3 nm. However, any suitable width may be utilized.

Embodiments disclosed herein are directed towards processes of deposition, doping, and annealing a gate dielectric layer 211 (e.g., hafnium oxide ($HfO_2$)) over channel regions of fins 107 to form a ferroelectric gate dielectric layer with multi-ferroelectric properties (multi-$P_r/E_c$) in the semiconductor device 100. However, these materials and processes may be used in other applications (e.g., planar transistors) and in other technologies (e.g., CMOS technologies), just by introducing the suitable dopant into hafnium oxide ($HfO_2$) in the gate stack process, without departing from the spirit of the invention and are considered within scope of the embodiments disclosed herein. Furthermore, the examples provided herein are directed towards the deposition of dielectric materials and dopant materials to desired thicknesses, annealing processes for driving dopant elements of the dopant materials into the dielectric materials, and transitioning crystalline phases of the doped dielectric materials such that ferroelectric properties of the doped dielectric materials are modified. However, other suitable materials, other suitable thicknesses, other suitable process conditions and other suitable crystalline phase transitions may be used and are considered within the scope of the embodiments disclosed herein. As such, the thermal budgets may vary according to film thicknesses and according to film compositions without departing from the spirit of the embodiments disclosed.

In accordance with an embodiment, a method includes: depositing a gate dielectric layer over a channel region of a fin; depositing a buffer layer over the gate dielectric layer; depositing a dopant film over the buffer layer; performing a diffusion anneal process to form a gradient depth profile of dopant concentrations within the gate dielectric layer; etching remaining portions of the dopant film and the buffer layer to expose the gate dielectric layer; depositing a capping layer over the gate dielectric layer; and performing a post-cap anneal process to crystallize the gate dielectric layer. In an embodiment, the gradient depth profile of dopant concentrations comprises a higher concentration of dopants within the gate dielectric layer adjacent to a top of the fin and a lower concentration of dopants within the gate dielectric layer adjacent to a bottom of the fin. In an embodiment, depositing the dopant film comprises depositing the dopant film with multiple thicknesses. In an embodiment, after the post-cap anneal the gate dielectric layer has a gradient depth profile of ferroelectric properties. In an embodiment, the gate dielectric layer has an orthorhombic crystalline phase. In an embodiment, the depositing the gate dielectric layer deposits hafnium oxide. In an embodiment, the depositing the dopant film deposits zirconium.

In accordance with another embodiment, a method includes: performing a diffusion anneal process to drive dopants from a dopant film, through a buffer layer, and into a gate dielectric layer over a fin; removing the dopant film and the buffer layer; depositing a capping layer over the gate dielectric layer; and crystallizing the gate dielectric layer to form a crystallized gate dielectric layer, wherein the crystallized gate dielectric layer has a first combination of crystallinity adjacent to a top of the fin and has a second combination of crystallinity adjacent to a bottom of the fin, the first combination being different from the second combination; removing remaining portions of the capping layer; and forming a metal gate electrode over the crystallized gate dielectric layer. In an embodiment, prior to performing the diffusion anneal process, the method further includes: depositing the gate dielectric layer in an opening between spacers over a channel region of the fin; and depositing the buffer layer and the dopant film over the gate dielectric layer, the dopant film having multiple thicknesses adjacent to the buffer layer. In an embodiment, the dopants comprise zirconium. In an embodiment, the opening between the spacers comprises vertical sidewalls. In an embodiment, the opening between the spacers comprises a tapered gate profile. In an embodiment, the opening between the spacers comprises a necking gate profile. In an embodiment, the opening between the spacers comprises a bamboo gate profile.

In accordance with yet another embodiment, a semiconductor device includes: a semiconductor substrate comprising a fin; spacers disposed adjacent the fin; a gate dielectric layer disposed over a channel region of the fin and between the spacers, wherein the gate dielectric layer comprises a dopant concentration gradient and a coercive field gradient; and a metal gate electrode over the gate dielectric layer. In an embodiment, the coercive field decreases as the depth from the top of the fin increases. In an embodiment, the gate dielectric layer comprises a doped hafnium oxide material. In an embodiment, the doped hafnium oxide material comprises zirconium. In an embodiment, wherein the dopant concentration decreases as the depth from the top of the fin increases. In an embodiment, the first crystallinity is an orthorhombic crystalline phase.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductor fin;
   a crystallized gate dielectric layer over a top surface and along sidewalls of the semiconductor fin, the crystallized gate dielectric layer comprising a dopant concentration having a gradient depth profile extending along the sidewalls of the semiconductor fin;
   a metal gate barrier layer over the crystallized gate dielectric layer; and
   a fill material over the metal gate barrier layer.

2. The semiconductor device of claim 1, wherein the crystallized gate dielectric layer comprises hafnium oxide.

3. The semiconductor device of claim 2, wherein the crystallized gate dielectric layer comprises zirconium.

4. The semiconductor device of claim 2, wherein the crystallized gate dielectric layer comprises lanthanum.

5. The semiconductor device of claim 2, wherein the crystallized gate dielectric layer comprises gadolinium.

6. The semiconductor device of claim 1, wherein the gradient depth profile has a larger dopant concentration adjacent to a top of the semiconductor fin and a lower dopant concentration adjacent to a bottom of the semiconductor fin.

7. The semiconductor device of claim 1, wherein the crystallized gate dielectric layer has a first crystallinity, and the first crystallinity is an orthorhombic crystalline phase.

8. A semiconductor device comprising:
   a crystallized gate dielectric layer overlying both a top surface and sidewalls of a semiconductor fin, the crystallized gate dielectric layer having a first combination of crystallinity adjacent to the top surface of the semiconductor fin and has a second combination of crystallinity adjacent to the sidewalls of the semiconductor fin at a bottom of the semiconductor fin, the first combination being different from the second combination; and
   a metal gate electrode over the crystallized gate dielectric layer.

9. The semiconductor device of claim 8, wherein the crystallized gate dielectric layer comprises dopants, the dopants having a variable gradient depth profile.

10. The semiconductor device of claim 9, wherein the dopants comprise zirconium.

11. The semiconductor device of claim 9, wherein the dopants comprise aluminum.

12. The semiconductor device of claim 9, wherein the dopants comprise lanthanum.

13. The semiconductor device of claim 9, wherein the dopants comprise yttrium.

14. The semiconductor device of claim 9, wherein the dopants comprise gadolinium.

15. A semiconductor device, comprising:
   a semiconductor substrate comprising a fin;
   spacers disposed adjacent the fin;
   an interfacial layer disposed over the fin, wherein a first portion of the interfacial layer is in direct physical contact with a top surface of the fin and a second portion of the interfacial layer is in direct physical contact with sidewalls of the fin;
   a gate dielectric layer disposed over a channel region of the fin and between the spacers, wherein the gate dielectric layer comprises a dopant concentration gradient and a coercive field gradient, wherein the gate dielectric layer is in direct physical contact with both the first portion of the interfacial layer and the second portion of the interfacial layer; and
   a metal gate electrode over the gate dielectric layer.

16. The semiconductor device of claim 15, wherein a coercive field decreases as a depth from a top of the fin increases.

17. The semiconductor device of claim 16, wherein the gate dielectric layer comprises a doped hafnium oxide material.

18. The semiconductor device of claim 17, wherein the doped hafnium oxide material comprises zirconium.

19. The semiconductor device of claim 15, wherein a dopant concentration decreases as a depth from a top of the fin increases.

20. The semiconductor device of claim 15, wherein the gate dielectric layer has a first crystallinity and the first crystallinity is an orthorhombic crystalline phase.

* * * * *